United States Patent
Ravi et al.

(10) Patent No.: US 8,030,119 B2
(45) Date of Patent: Oct. 4, 2011

(54) INTEGRATED METHOD AND SYSTEM FOR MANUFACTURING MONOLITHIC PANELS OF CRYSTALLINE SOLAR CELLS

(75) Inventors: Tirunelveli S. Ravi, San Jose, CA (US); Ananda H. Kumar, Fremont, CA (US); Ashish Asthana, Fremont, CA (US)

(73) Assignee: Crystal Solar, Inc., Santa Clara, CA (US)

( * ) Notice: Subject to any disclaimer, the term of this patent is extended or adjusted under 35 U.S.C. 154(b) by 279 days.

(21) Appl. No.: 12/399,248

(22) Filed: Mar. 6, 2009

(65) Prior Publication Data
US 2009/0227063 A1 Sep. 10, 2009

Related U.S. Application Data

(60) Provisional application No. 61/068,629, filed on Mar. 8, 2008.

(51) Int. Cl.
*H01L 21/00* (2006.01)
(52) U.S. Cl. ........ 438/73; 438/96; 257/E21.09; 136/244
(58) Field of Classification Search .................... 438/57, 438/73, 96; 257/E21.09; 136/244, 252
See application file for complete search history.

(56) References Cited

U.S. PATENT DOCUMENTS

| | | |
|---|---|---|
| 3,653,970 A | 4/1972 | Iles |
| 4,301,324 A | 11/1981 | Kumar et al. |
| 5,458,755 A | 10/1995 | Fujiyama et al. |
| 6,143,629 A | 11/2000 | Sato |
| 6,190,937 B1 | 2/2001 | Nakagawa et al. |
| 6,211,038 B1 * | 4/2001 | Nakagawa et al. ........... 438/409 |
| 6,258,666 B1 | 7/2001 | Mizutani et al. |
| 6,331,208 B1 | 12/2001 | Nishida et al. |
| 6,428,620 B1 | 8/2002 | Yamagata et al. |
| 6,452,091 B1 | 9/2002 | Nakagawa et al. |
| 6,551,908 B2 | 4/2003 | Ukiyo et al. |

(Continued)

FOREIGN PATENT DOCUMENTS

JP 62-224089 A 10/1987

(Continued)

OTHER PUBLICATIONS

International Search Report and Written Opinion issued for PCT/US2010/048058 on Oct. 22, 2010.

(Continued)

*Primary Examiner* — Tuan N. Quach
(74) *Attorney, Agent, or Firm* — David H. Jaffer; Pillsbury Winthrop Shaw Pittman LLP

(57) ABSTRACT

A method for fabricating a photovoltaic (PV) cell panel wherein all PV cells are formed simultaneously on a two-dimensional array of monocrystalline silicon mother wafers affixed to a susceptor is disclosed. Porous silicon separation layers are anodized in the surfaces of the mother wafers. The porous film is then smoothed to form a suitable surface for epitaxial film growth. An epitaxial reactor is used to grow n- and p-type films forming the PV cell structures. Contacts to the n- and p-layers are deposited, followed by gluing of a glass layer to the PV cell array. The porous silicon film is then separated by exfoliation in a peeling motion across all the cells attached together above, followed by attaching a strengthening layer on the PV cell array. The array of mother wafers may be reused multiple times, thereby reducing materials costs for the completed solar panels.

18 Claims, 24 Drawing Sheets

U.S. PATENT DOCUMENTS

| | | | |
|---|---|---|---|
| 6,802,926 | B2 | 10/2004 | Mitzutani et al. |
| 6,818,104 | B2 | 11/2004 | Iwasaki et al. |
| 7,014,748 | B2 | 3/2006 | Matsumura et al. |
| 7,259,321 | B2 * | 8/2007 | Oswald et al. ................. 136/244 |
| 7,732,243 | B2 * | 6/2010 | Luch ............................. 136/244 |
| 2005/0121068 | A1 | 6/2005 | Sager et al. |
| 2008/0057678 | A1 | 3/2008 | Gadkaree et al. |
| 2008/0160661 | A1 | 7/2008 | Henley |
| 2008/0179547 | A1 | 7/2008 | Henley |
| 2008/0264477 | A1 | 10/2008 | Moslehi |
| 2009/0217976 | A1 | 9/2009 | Cart et al. |
| 2010/0108130 | A1 * | 5/2010 | Ravi ............................. 136/255 |

FOREIGN PATENT DOCUMENTS

| | | |
|---|---|---|
| JP | 07-302889 | 11/1995 |
| JP | 08-213645 | 8/1996 |
| JP | 2001-158680 A | 6/2004 |
| JP | 2005-038964 A | 2/2005 |
| JP | 2005-038964 A | 2/2005 |
| KR | 10-2002-0073816 A | 9/2002 |

OTHER PUBLICATIONS

Riepe, S., et al.; "Silicon Material Technology and Evaluation Center (SIMTEC) At Fraunhoffer ISE—Achievements and Visions," presented at the 23$^{rd}$ European Photovoltaic Solar Energy Conference and Exhibition, Sep. 1-5, 2008, Valencia, Spain; 6 pages.

Reber, S., et al., "Progress in High-Temperature Silicon Epitaxy Using the RTCVD160 Processor," 19$^{th}$ European Photovoltaic Solar Energy Conference, Jun. 7-11, 2004, Paris, France; pp. 471-474.

Hurrle, A., "High-Throughput Continuous CVD Reactor for Silicon Deposition," 19$^{th}$ European Photovoltaic Solar Energy Conference, Jun. 7-11, 2004, Paris France; pp. 459-462.

Brendel, et al, "Crystalline Thin-Film Silicon Solar Cells from Layer-Transfer Processes: A Review," Proc. 10$^{th}$ Workshop on Crystalline Silicon Solar Cell Materials and processes, Aug. 13-16, 2000, Copper Mountain, USA, ed. by B.L. Sopori, (NREL, Golden, 2000), pp. 117-125.

Weber, K.J., et al., Silicon as a Photovoltaic Material, Materials Forum, vol. 27 (2004) pp. 9-14.

Unagami, T., "Formation Mechanism of Porous Silicon Layer by Anodization in HF Solution," J. Electrochem. Soc.: Solid-State Science and Technology, vol. 127, Issue 2, Feb. 1980; pp. 476-483.

Brendel, Rolf, et al.; "15.4%-effiencient and 25 μm-thin crystalline Si solar cell from layer transfer using porous silicon," Phys. Stat. Sol. (a) 197, No. 2, (2003); pp. 497-501.

Green, M.A., "Crystalline Solar Cells," Chapter 4 (pp. 139-187) of Celan Electricity from Photovoltaics Series on Photoconversion of Solar Energy—vol. 1 (2001) Imperial College Press, Eds. Mary D. Archer & Robert Hill, Available on-line at http://www.worldscibooks.com/etextbook/p139/p139_chap4.pdf.

Brendel, R., et al., EMRS 2007 Starsbourg, Conference presentation D-9-1. Available on-line at http://www.isfh.de/institut_solarforschung/files/thin_film_si_wafer_cell.pdf.

Gazuz, V., et al.; "Thin 60 μm-Thick Crystalline Silicon Solar Cell on Ceramic Substrate by Al-Bonding," Bavarian Center for Applied Energy Research (ZAE Bayern), Am Weichselgarten 7, D-91058 Erlangen, Germany, IEEE 2006, pp. 976-979.

Snoeckx, K., et al.; "The Potential of Thin-film Crystalline Silicon Solar Cells," Semiconductor International, Jun. 1, 2007, available at HighBeam Research at http://www.highbeam.com.

Kumar, A.H., et al.; "State-of-the-Art, Glass-Ceramic/Copper, Multilayer Substrate for High Performance Computers," The International Journal for Hybrid Microelectronics, vol. 14, No. 4, Dec. 1991, pp. 137-150.

Park, K.H., et al.; "The correlation between the crystalline phases and optical reflectance in glass-ceramics for IR reflector," Journal of Ceramic Processing Research, vol. 3, No. 3, pp. 153-158 (2002).

Ford D.H., et al.; "High Current, Thin Silicon-on-Ceramic Solar Cell," IEEE Transactions on Electron Devices, vol. 46, No. 10, Oct. 1999, 3 pages.

* cited by examiner

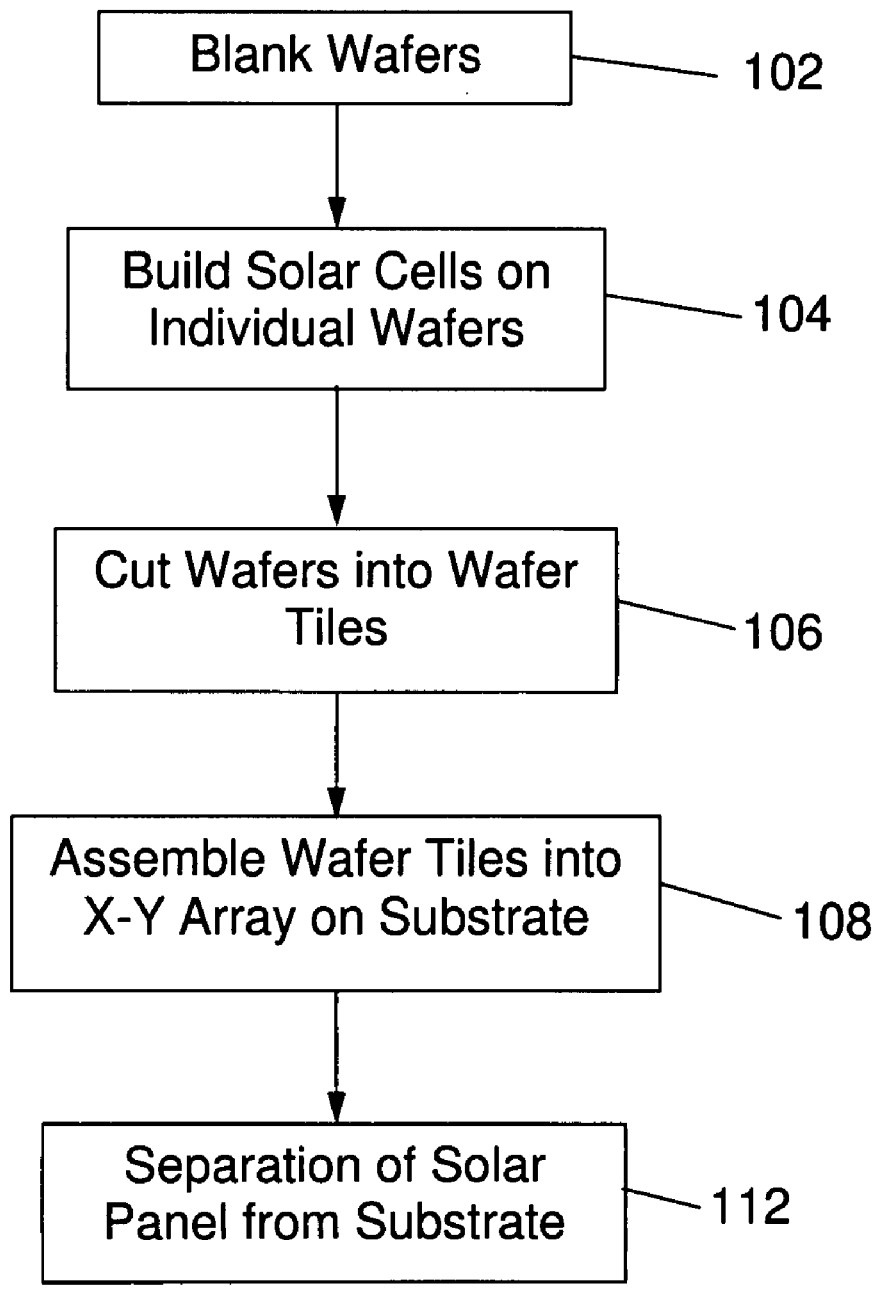
FIG. 1  *PRIOR ART*

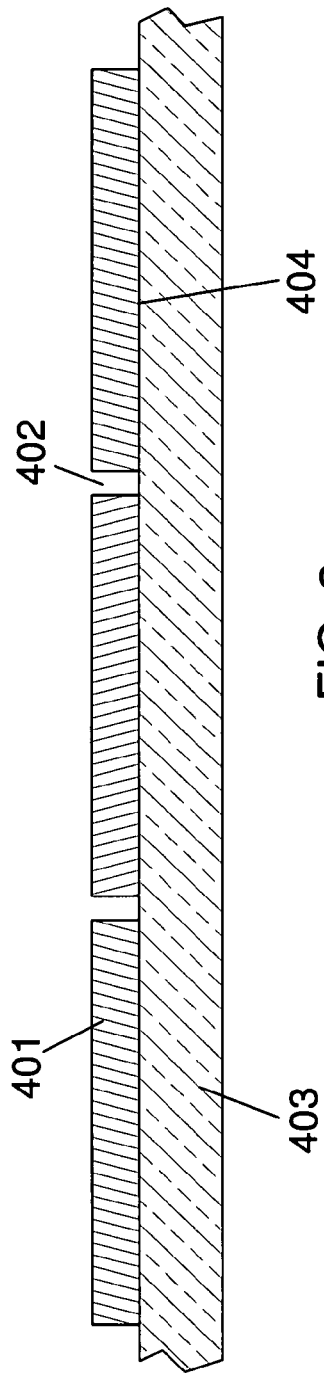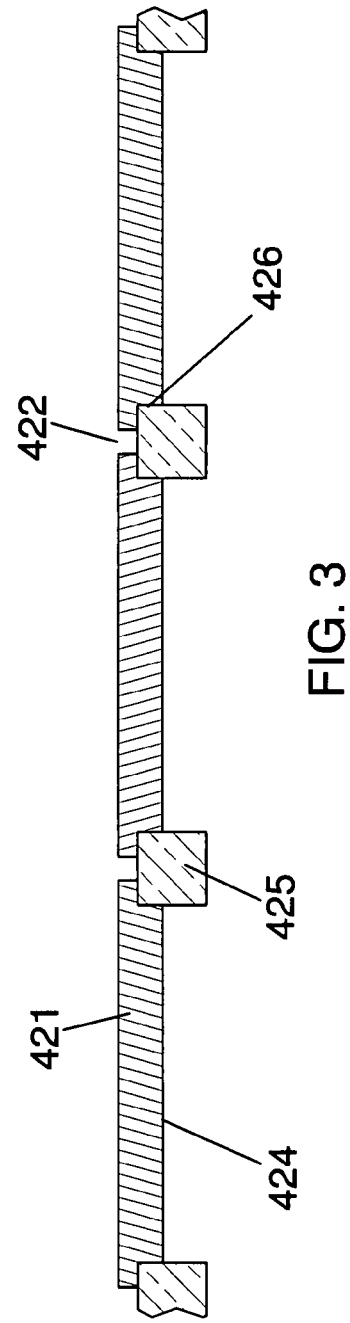

FIG. 16  SECTION A-A

INTEGRATED METHOD AND SYSTEM FOR MANUFACTURING MONOLITHIC PANELS OF CRYSTALLINE SOLAR CELLS

RELATED APPLICATION

This application claims benefit of provisional application 61/068,629, filed Mar. 8, 2009, incorporated herein by reference.

BACKGROUND OF THE INVENTION

1. Field of the Invention

This invention relates generally to methods and systems for fabricating solar cells. More particularly, it relates to fabricating an array of solar cells by simultaneously processing commonly supported mother wafers, enabling the simultaneous growth of multiple photovoltaic cell structures.

2. Description of the Related Art

Silicon is the basic ingredient of many solar cell technologies ranging from thin film amorphous silicon solar cells to single-crystal silicon wafer-based solar cells. High efficiency solar cells start with electronic grade polysilicon grown by chemical vapor deposition. The polysilicon is melted and ingots are pulled from the melt in the Czochralski process and often zone refined to produce silicon ingots or ribbons of different degrees of crystal perfection. The silicon ingot is then sliced into thin wafers by sawing or laser cutting, and solar cells are formed on the wafers by traditional semiconductor techniques and interconnected and packaged to last at least 25 years. Such silicon wafers are relatively expensive and thus severely impact the costs of solar cells in formed and packaged in the standard wafers.

Throughout the past quarter century, there have been significant innovations in all aspects of solar cell manufacture and accompanying reduction in cost. For example, from 1990 to 2006, wafers have decreased in thickness from 400 µm to 200 µm. The cost of crystalline silicon still constitutes a significant part of the overall cost, as measured by many of the metrics used to characterize the cost of crystalline solar technology.

A flow chart of a conventional process for manufacturing solar panels is illustrated in FIG. 1. In step 102, stock single-crystal silicon wafers are used as substrates for fabricating in step 104 the structure of the photovoltaic (PV) cell structure, which is basically a diode on the top surface of the wafers. The fabrication process uses epitaxial or diffusion furnace methods to form the required thin silicon layers doped n-type and p-type and sometimes intrinsic (i-type). After the PV cells have been fabricated, in step 106, the wafers are cut into "tiles", which are typically approximately square, often with rounded corners due to the size and shape of the original wafer (200 mm diameter typically), which is slightly smaller than the diagonal dimension of the square PV wafer. The wafer tiles are then assembled into an X-Y array on a substrate 108 and contacts to the n-type and p-type layers are added, often by soldering tinned copper ribbons to bus bars grown on the PV wafers. It has been difficult or impossible to attain very think solar cells using the prior art process in which individual PC cells are formed prior to assembly into the final X-Y array needed for a completed solar panel.

The best expectation for further reductions in silicon thickness, and thereby the cost of monocrystalline silicon solar cells, is offered by techniques in which a crystal monocrystalline silicon substrate, often referred to as the base, source or mother wafer, is first treated to form a separation layer, a thin epitaxial silicon layer is then deposited on the treated surface, and finally the deposited epitaxial layer is separated from the source substrate to be used as thin (2-100 µm) single crystal silicon solar cells. The silicon substrate is thereafter sequentially re-used to form several additional such epitaxial layers, each producing its own solar cell. There are several known standard techniques for growing the separation layer, such as forming a composite porous silicon layer by anodically etching a discontinuous oxide masking layer, or by high energy implantation of oxygen or hydrogen to form the separation layer within mother wafer.

The epitaxial silicon layer that is formed has to be separated intact from the mother wafer with little damage in order to thereafter fabricate the eventual solar cell module. The separation may be preceded by formation of the p-n junctions and of part or all of the interconnections while the epitaxial layer is still attached to the mother wafer. We believe that this separation process is preferably done by 'peeling' in the case where the separation layer is highly porous silicon. Peeling implies parting of an interface starting from one edge and continuing until complete separation occurs.

One basic process in the prior art for manufacturing epitaxial single crystal silicon solar modules includes the following steps: (1) forming a separation layer on a relatively thick, single crystal silicon substrate; (2) growing a single crystal epitaxial layer and fabricating the solar cells on the epitaxial layer and the basic cell interconnections on the solar cells; (3) separating the epitaxial layer at the cell level; and (4) assembling and packaging several such cells to form a solar panel. Despite the great potential of this prior art method for producing relatively inexpensive, highly efficient solar cells, the method has eluded commercial success for at least three main reasons: (1) some of the unit processes are deficient and difficult to reproduce; (2) manufacturing strategy generally starts and ends with making individual wafer-size solar cells and, thereafter, assembling them into solar panels; and (3) thin cells break easily, and their economical processing awaits the development of new tools and equipment.

SUMMARY OF THE INVENTION

The present invention turns the prior art strategy on its head, starting with the solar panel and rethinking the unit manufacturing steps in panel size, starting from the surface treatment of the source wafers through to module encapsulation, completely eliminating the need for handling individual thin epitaxial silicon cells. According to one aspect of the invention, the manufacturing sequence is reversed from the conventional prior art sequence. In this aspect of the invention, multiple source wafer tiles are bonded to a support prior to the formation of individual cells, thereby enabling the use of large-scale processing for solar cell fabrication, instead of the wafer-by-wafer approach previously used. This rethinking involves key innovations that make these unit processes robust and reliable. This approach has been enabled by some key innovations described in this invention. This essentially fulfills the vision for the 2020 module, where "Cell and module manufacturing is based on process steps applied to whole panels instead of individual cells" articulated by G. Beaucarne et al. at the 21st European PVEC Conference in 2006. More importantly, panel size semiconductor processing enables a significant reduction in the cost of solar energy production.

One aspect of the invention includes mounting multiple wafers on a support plate, often called a susceptor, and processing the wafers in common. Examples of the processing include forming a separation layer, depositing silicon to form the solar cell structure, forming contacts, and separating the solar cells as a unit from the wafers.

Another aspect of the invention includes forming a separation layer in the multiple wafers by anodizing preferably monocrystalline wafers to form a porous silicon layer. Although the anodization may be done on an assembled array of solar cell tiles, it may also be done on individual wafers.

The support plate for anodization may be generally planar or may have windows formed therethrough for exposing the back side of the wafers supported on the ribs surrounding the windows. Thereby, liquid electrolyte may be used as a backside contact.

The anodization may be performed in a serial arrangement of multiple wafer supports removably disposed and arranged between the anode and cathode in tank containing electrolytic etching solution. The supports are sealed to the tank walls.

The anodization forms a porous silicon layer. If desired, the porosity may be graded by varying the anodization conditions during the anodization.

The porous silicon layer may be smoothed to provide a better epitaxial base, for example, by a high temperature anneal in hydrogen, for example, a temperature of at least 1000 C.

Silicon layers, preferably epitaxial, may be deposited by chemical vapor deposition on the porous silicon layer. Dopant precursors may be included in the deposition to produce a layered semiconductor structure including p-n junctions. The epitaxial deposition may be performed in a radiantly heated reactor with wafers mounted inside of a sleeve formed on two sides by wafer supports each mounting an array of solar cells.

Contacts may be fully or partially added to the silicon structures still attached to the wafer supports. Additional layers may be applied to facilitate further processing.

The fully or partially processed solar cells may be delaminated from the mother wafers across the separation (porous) layer by a progressive peeling action including clamps and a linear array of vertical actuators associated with the clamps. Examples of the clamps are segmented electrostatic clamps or a segmented vacuum clamp.

BRIEF DESCRIPTION OF THE DRAWINGS

FIG. 1 is a flow chart of a prior art manufacturing process for solar panels.

FIG. 2 is a schematic side cross-sectional view of mother wafers attached to a susceptor without windows.

FIG. 3 is a schematic side cross-sectional view of mother wafers attached to a susceptor with windows.

DETAILED DESCRIPTION

Solar Panel

Figure 4:
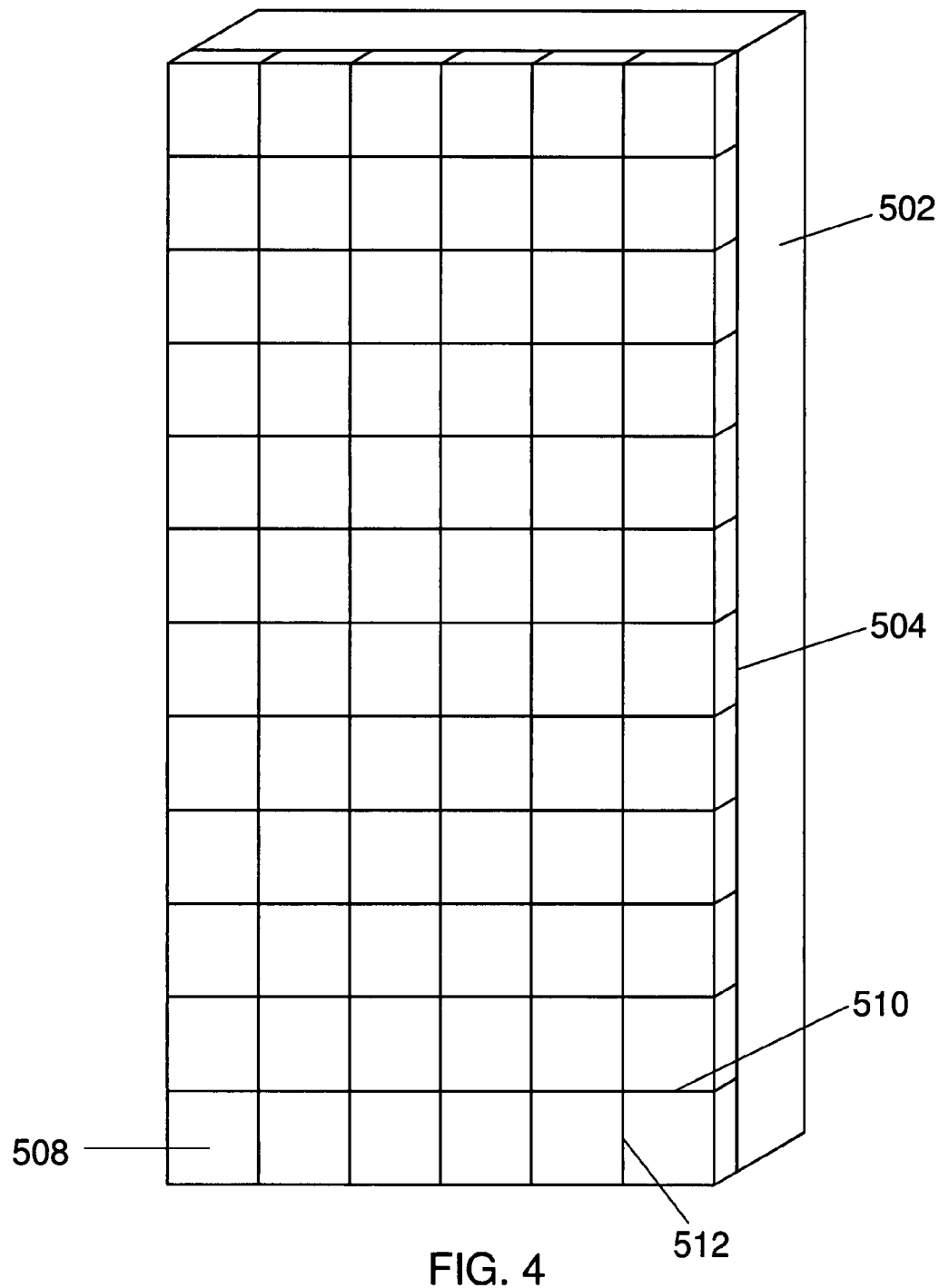
FIG. 4 is a schematic isometric view of wafers attached to a susceptor.

In one aspect of the invention, the solar panel includes an array of thin single crystal silicon solar cells, wherein the thin single crystal wafers are epitaxially grown and processed together as an array on a 'template'. In the array, multiple relatively thick single crystal silicon base or mother wafers are attached to a suitable carrier substrate or susceptor. The assembly of susceptor and array of mother wafers will be called an 'array template'. After completion of the cell fabrication steps, the entire solar cell array is permanently adhered to a suitable support sheet with an appropriate adhesive and separated as one unit from the array template. The array template may then be reused to fabricate another solar cell array. The array template of this invention may consist of a closely tiled array of circular, rectangular or square, single crystal silicon wafers formed on one of the following three types of substrates: (1) a wafer tile cut from a conventional thin silicon wafers; (2) a wafer tile cut from a thick, zone-refined, single-crystal silicon block; and (3) a wafer tile cut from a composite structure comprising the following two blocks laminated together of (a) a thick, zone-refined, single-crystal silicon block, and (b) a thick, non-device-quality, silicon block.

The assembly onto a support substrate of multiple rectangular or square epitaxial wafer tiles, hereinafter simply referred to as 'source wafer tiles', unlike the usual circular wafers, allows for the densest packing of cells in the panel. The machining loss of high quality silicon has no major impact on the overall cost of silicon, while the close-packed array pays great dividends because of the gain in cell density on the panel. As described below, independent of the thickness of the wafer tile, the preferred thickness for the final solar cell is in the preferred range of 25-50 µm, separated from the upper surface of the wafer tiles in the closely tiled array, as described in section below regarding separation.

Array Template

This section describes the formation of an array template, which is the first step in the large-substrate manufacturing process outlined above. Since the substrate of the template supports the wafers during epitaxial deposition, it also serves as the susceptor for the epitaxial growth process.

FIG. 2 is a schematic side cross-sectional view of wafers 401 attached to a susceptor 403, which in this embodiment may be a flat sheet or generally planar plate without windows. For effective subsequent processing steps, it is important to minimize the width of gaps 402 between the wafer tiles 401. Typically, the wafers 401 are silicon and are doped to be conductive for reasons described below. The wafers 401 should be monocrystalline to allow the subsequent epitaxial growth of generally monocrystalline silicon. Excessively large gaps 402 may result in undesirable particle generation during subsequent processing steps. The lower surfaces of the wafer tiles 401 are bonded to a support substrate 403 to ensure that the upper surfaces of the wafer tiles are approximately co-planar. The co-planarity involves two requirements: (1) the thicknesses of wafer tiles 401 must be uniform, and (2) the thicknesses of a bond layer 504 in FIG. 4 between the back surfaces of the wafer tiles 401 and the top surface of the susceptor 403 must be uniform. The desire for co-planarity arises from the desire to reduce or eliminate deposition on the exposed edges of the wafer tiles at the gaps 402.

To optimize the anodic etching process used to form the porous silicon layer (see FIGS. 5-7), it may be desirable to provide good electrical contact not only between the electrolytic etching solution and the frontsides of the wafers but also between the etching solution or other electrolytic liquid and the backsides of the wafer tiles being etched. Thus, FIG. 3 shows a schematic side cross-sectional view of wafers 421 attached to a susceptor 425 with windows 424 between ribs 426 of the susceptor 425 providing good backside contact to the etching solution in addition to separate frontside contact to the etching solution. The same considerations with respect to the gaps 402 in FIG. 2 apply to gaps 422 in FIG. 3. In this embodiment, the backsides 424 of the wafers 421 are open to the etchant solution through the windows 424, which are of the same general shape and only slightly smaller the tiles 421. That is, the ribs 426 form a rectangular grid and the ribs 426 support and are sealed to the peripheries f the wafers 421.

FIG. 4 is a schematic isometric view of wafers 508 attached in a two-dimensional array to a susceptor 502, more generally called a support. The horizontally extending gaps 510 and vertically extending gaps 512 between the wafers 508 should be minimized due to the considerations discussed above with reference to FIGS. 2 and 3. A large number (in the illustrated example, 12×6=72) of wafer tiles 608 are shown attached to the substrate 502.

The susceptor 502 must be fabricated from a material which is compatible with device processing conditions such as chemical vapor deposition, plasma etching, contact formation, and such. Appropriate materials for the susceptor 502 may be ceramic or metal. Examples of ceramics or otherwise robust materials are alumina, aluminum nitride, silicon carbide, silicon-impregnated silicon carbide, silicon, silicon nitride, boron nitride, boron carbide, etc. A planar susceptor needs to be electrically conductive to the anodizing current while a windowed susceptor, though preferably conductive, may be insulating. The wafer tiles 508 can be held to the surface 504 of the susceptor 502 by mechanical clamps, by machined dove tail joints, by gravity, or simply by a bond to the support by field assisted bonding well known in the art. The bonding is needed only once for an array template used in forming a large number of solar cell arrays. Such large area device fabrication is routinely done for large displays, and even for thin film solar panels.

Porous Silicon Layer Process

The next steps in the described process for manufacturing solar panels involve the formation of a porous silicon separation layer. The purpose of this layer is to enable the reuse of the silicon wafer tiles in the tiled array created in FIG. 4 as described above. This reuse is possible because the solar cells do not need the full thickness of the wafer tiles, but instead they need only a partial thickness of the tiles in a preferred range of 25-50 µm as described in above section on the solar panel. Since the thickness of the mother wafer tiles is typically at least hundreds of microns (even for thin silicon wafers) and can be up to 10 mm or greater (for thick silicon blocks or laminated silicon wafers or blocks), it is possible to fabricate a substantial number of solar cell arrays from a single array of wafer tiles. In order to use only a thin slice of the full wafer tile thickness, it is necessary to build the solar cells on top of a porous silicon separation layer. K. V. Ravi in co-pending U.S. patent application Ser. Nos. 12/290,582 and 12/290,588, both filed Oct. 31, 2008, incorporated herein by reference, describes the fabrication processes for backside contact PV cells, and frontside/backside contact PV cells, respectively, and are incorporated by reference herein. The described processes involve the formation of a porous surface layer in the mother wafers and growth of an epitaxial layer over the porous layer, and at least partial development of the solar cell in the epitaxial layer while still attached to the array template. After the array of solar cells has been at least partially fabricated in the epitaxial layer, the tile array can be separated from the bulk silicon material of the source wafer tile array, leaving most of the bulk material remaining in the mother wafers to be used in the formation of additional arrays of solar cells. For subsequent uses of the source wafer tile array to form second, third, fourth, etc., solar cell arrays, the surface of the mother wafers would be the typically rough lower surface of the cleaved porous silicon layer formed in FIGS. 5-7, below.

We have discovered that a lapped surface on the silicon source wafer is especially suited for ease of peeling of the epitaxial layer. Although we are not bound by the theory, we believe that the residual surface damage in the lapped surface pre-disposes the porous layer formed thereon to be easily detached. Lapping produces a surface roughness intermediate that produced by grinding and polishing. Lapping involves rotating a planar surface of a disk, often metal and perhaps textured or grooved, against the surface with typically a lapping powder being disposed between the disk and the surface. It typically produces an RMS surface roughness of 50 to 100 nm. Grinding involves rotating the circular face of an abrasive grinding wheel against the workpiece surface. It typically produces an RMS surface roughness of greater than 100 nm. Polishing is similar to lapping but uses a softer polishing powder and a typically softer non-metallic polishing pad to typically produce a surface roughness of less than 50 nm. The rougher ground silicon surface is rougher than a lapped surface and may enable even easier peeling, but the rougher ground surface may lead to too many defects in the epitaxial layer grown thereon. A polished silicon surface, on the other hand, may be nearly free of surface flaws, but we believe that the porous layer formed thereon will be relatively more difficult to detach.

Figure 5:
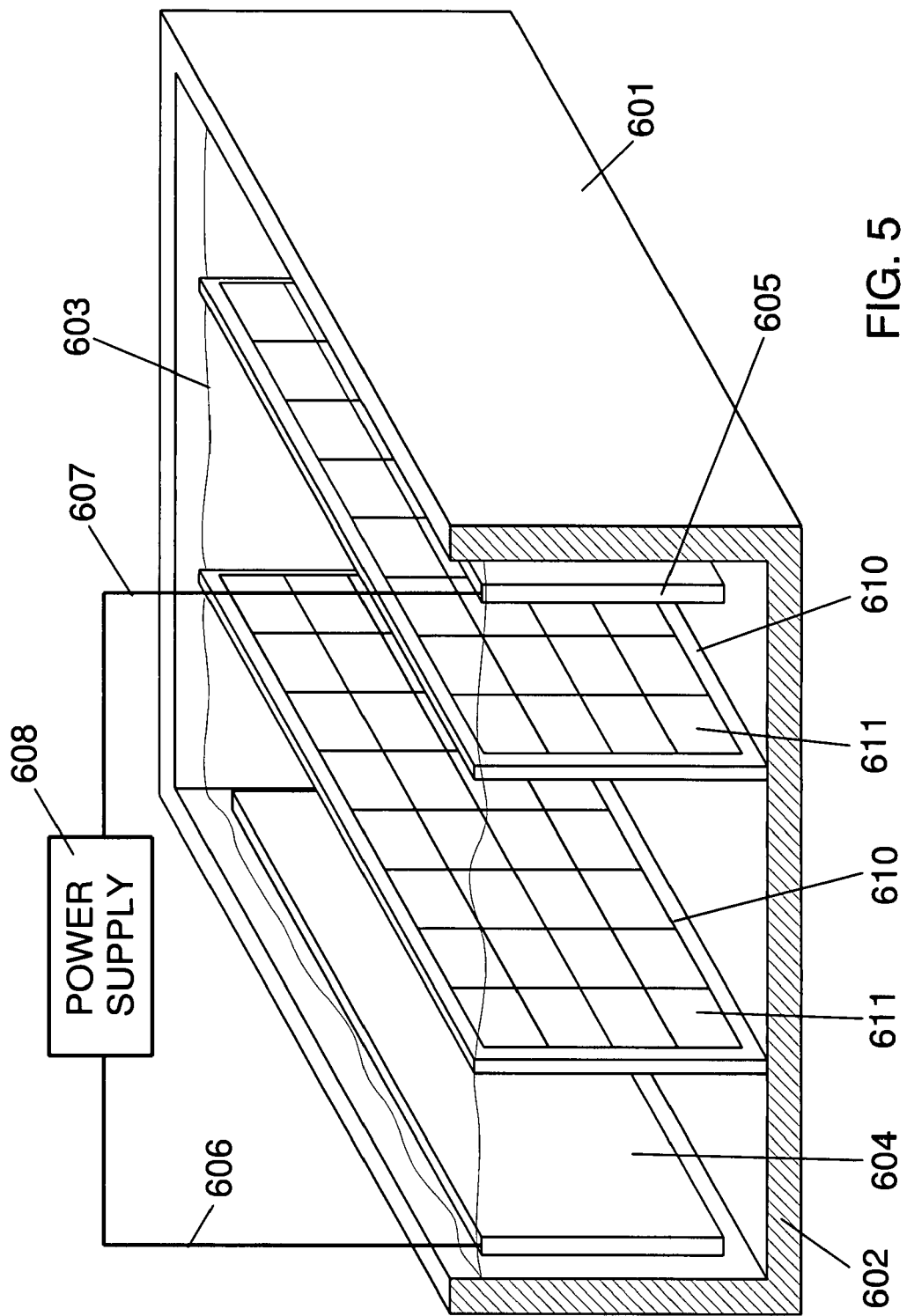
FIG. 5 is a schematic isometric view of an anodic etcher capable of simultaneously etching multiplicities of wafers attached in a vertical orientation to each of a plurality of susceptors.

A schematic isometric view of an anodic etcher capable of simultaneously etching multiplicities of wafers attached in a vertical orientation to each of a plurality of susceptors is shown in FIG. 5. The anodic etcher 601 contains within dielectric tank walls two electrodes 604, 605 preferably formed of platinum and electrically connected to a power supply 606 by respective wires 606, 607. One or more susceptors 610, each having a multiplicity of wafer tiles 611 affixed thereto, are removably immersed in the electro-etching solution 603, typically hydrofluoric acid (HF). If the windowed susceptor shown in FIG. 3 is used, then both the front and back sides of the wafer tiles 611 will be exposed to the electrolytic solution, but the wafer tiles 611 need to be sealed to the ribs 425 of the windowed susceptor 426 to electrically isolate the electrolytic solutions at the front and back. A conductive windowed susceptor is preferred for anodization although it presents some challenges. Alternatively, one or more holes through an otherwise planar susceptor for each wafer provides liquid contact to the wafers. Alternatively, the non-windowed susceptor shown in FIG. 2 may be used if the susceptor is electrically conductive and in good electrical contact with the source wafers affixed thereto.

Furthermore, if the edges of the susceptors 610 form a seal against the internal walls of the anodization tank 601 interrupting the electrical path of the electrolytic solution and the etching solution does not extend over the top of the susceptors 610, then the susceptors 610 and their attached wafer 611 will essentially form electrodes in a serial arrangement for the anodic etching process and not require actual electrical connections of the wafers or susceptors to the power supply 606. The liquid backside contact is advantageous in ensuring uniform etching across the surfaces of the wafers 611. With proper bias on the power supply 606, i.e., a positive bias on the fronts of the wafers relative to their backs, only the front surfaces of the wafers 611 will react with the HF solution 603 as is familiar to those skilled in the art. As mentioned above, a top surface of the electrolytic solution 603, typically hydrofluoric acid, is below the tops of the susceptors 610 to ensure that each susceptor 610 and attached wafers 611 form a separate electrode in the electro-etching circuit.

Etching a large array of silicon wafers to produce the needed porous layer structures requires uniform anodic current distribution across individual wafers, and between all wafers in the array. Further, the silicon wafers need to be conductive to the anodization current, for example, having an electrical conductivity in the range of 0.001 to 0.1 ohm-cm, 0.02 ohm-cm being a convenient value. Either p-type or n-type silicon wafers can be anodized. Discrete metal electrode contacts for either the anode or cathode do not yield the desired level of uniformity in etching, leading to non-uniformities even within single wafers. We have observed that using the electrolyte itself as the electrical contact to both sides of the wafers in a vertical etcher virtually eliminates these non-uniformities. Here, the same current density flows through all the wafers in the array. The volumes between each pair of susceptors or between a susceptor and an electrode are essentially like the individual cells in a serially connected battery. Such a scheme also allows for anodic etching of several panels in parallel in a vertical configuration as shown in FIGS. 3-5. This novel scheme produces uniform anodic etching on each wafer surface and the same etching uniformity across all wafers in a panel, an important feature enabling processing at the panel level. When the wafers are attached to the susceptor or support substrate, the support substrate needs to be in good electrical contact with the wafer, and should be a good electrical conductor itself. Alternatively, the susceptor may have openings or slots to allow for the electrolyte to directly contact the wafer back sides. These innovations enable very high throughputs in production.

Figure 6:
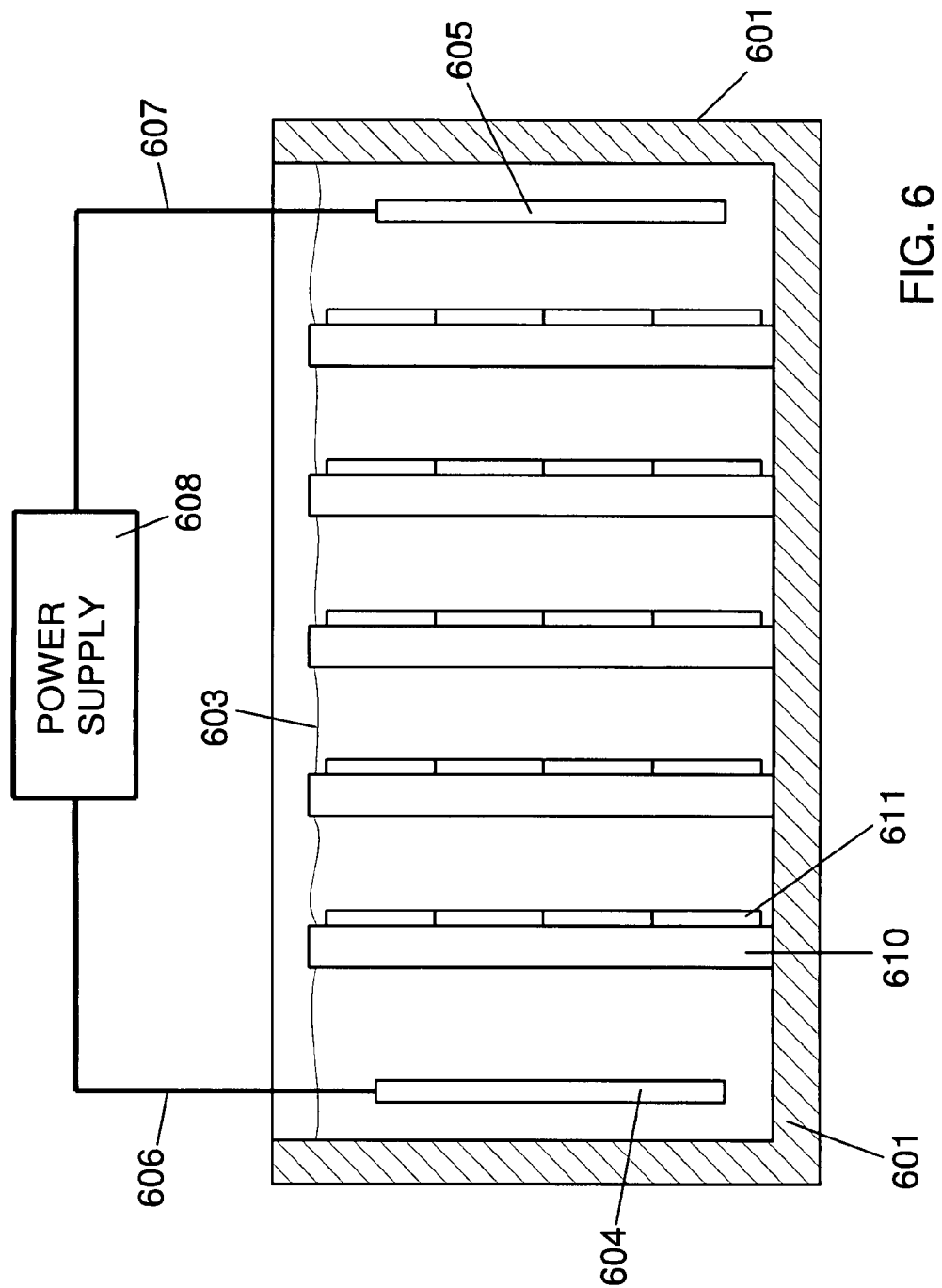
FIG. 6 is a schematic side cross-sectional view of the anodic etcher of FIG. 5.

An embodiment of an anodization tank shown in a schematic side cross-sectional view of FIG. 6 of the anodic etcher 601 of FIG. 5 can contain up to at least five susceptors 610, each having a multiplicity of wafers 611 affixed thereto. The manufacturing sequences described in FIGS. 20 and 21 would employ such an electro-etching arrangement.

Figure 7:
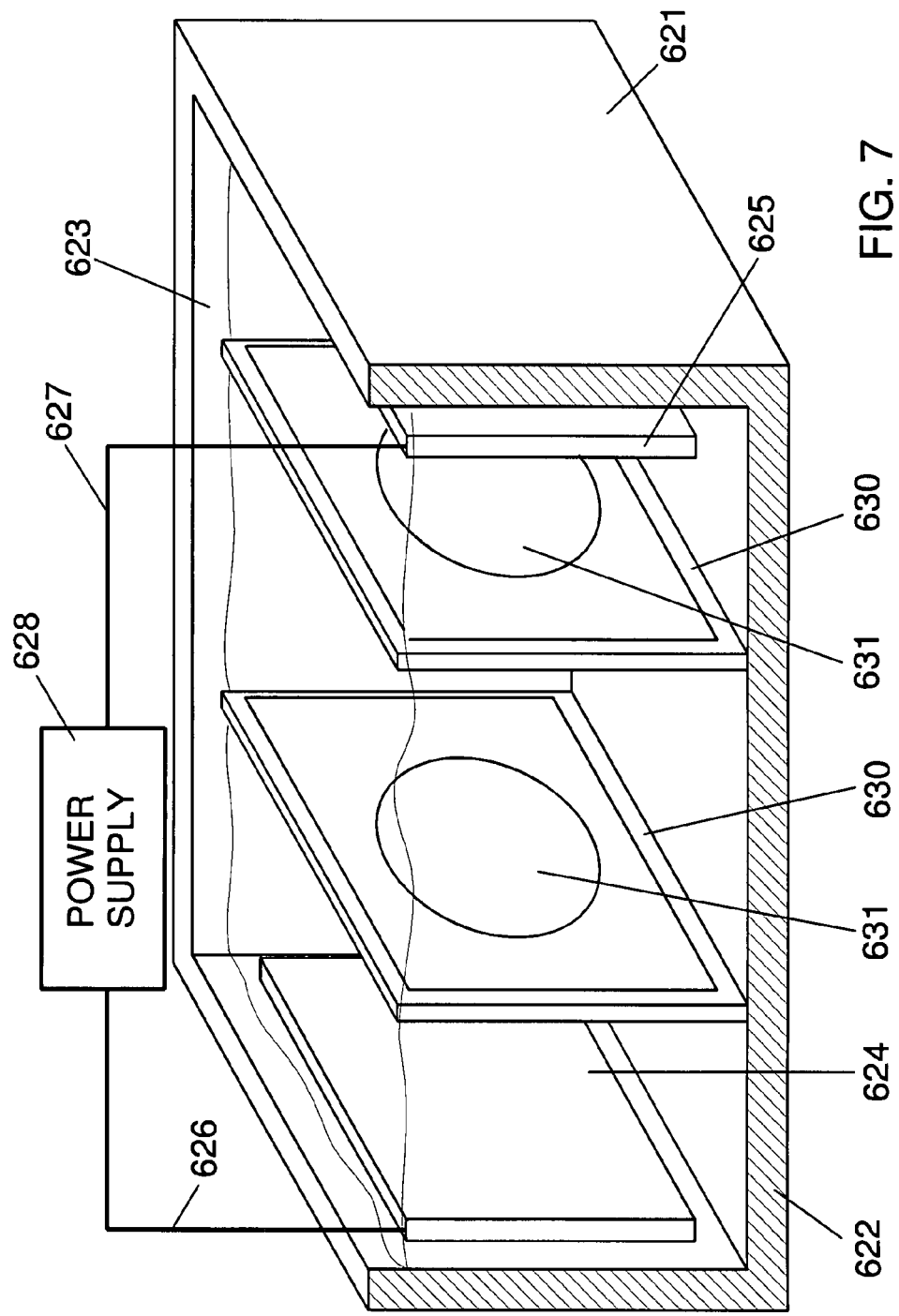
FIG. 7 is a schematic isometric view of an anodic etcher capable of simultaneously etching a number of wafers, each attached in a vertical orientation to a support frame.
Figure 22:
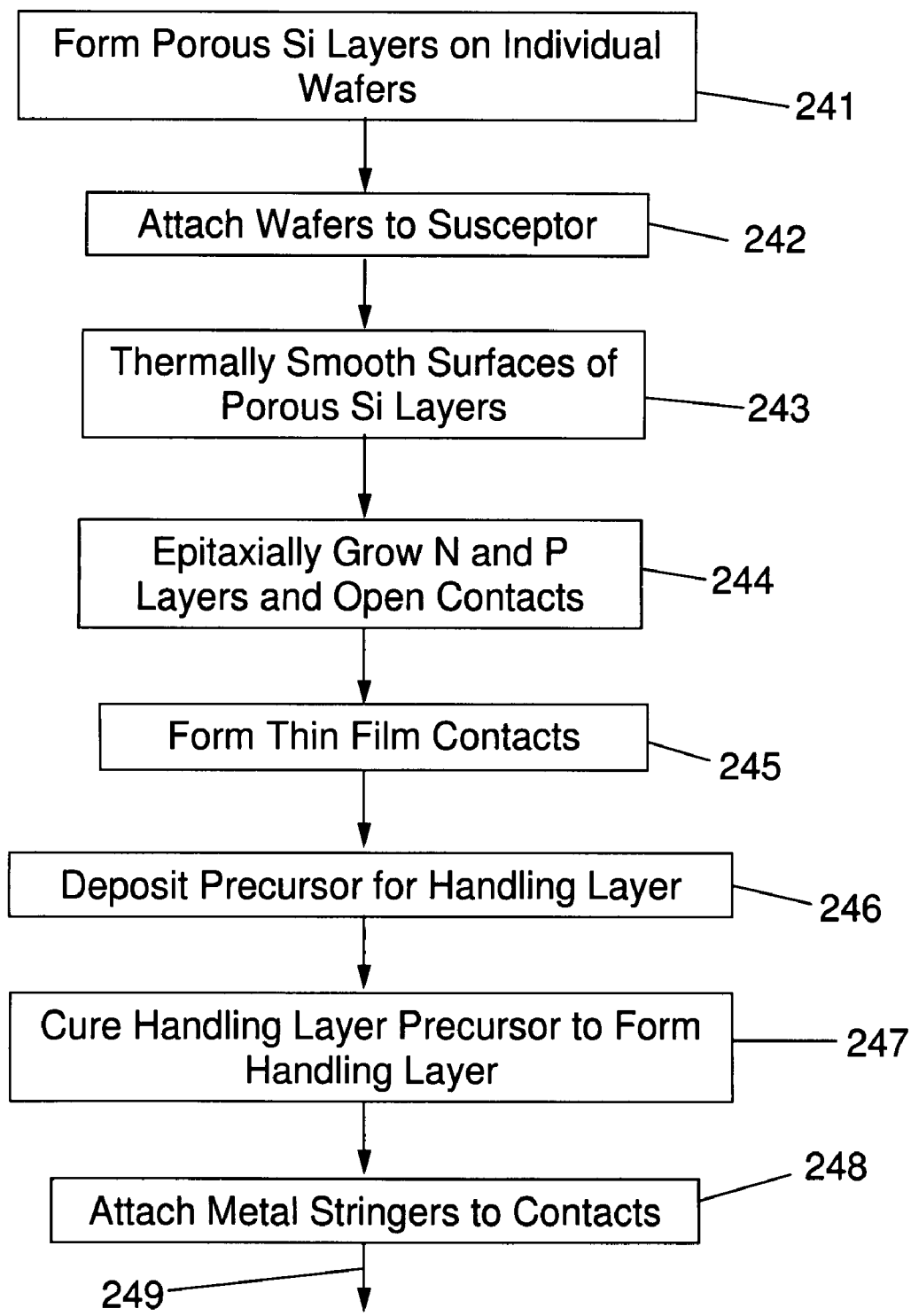
FIG. 22 is a flow chart of the first part of a manufacturing process for solar panels in a third embodiment of the present invention.
Figure 23:
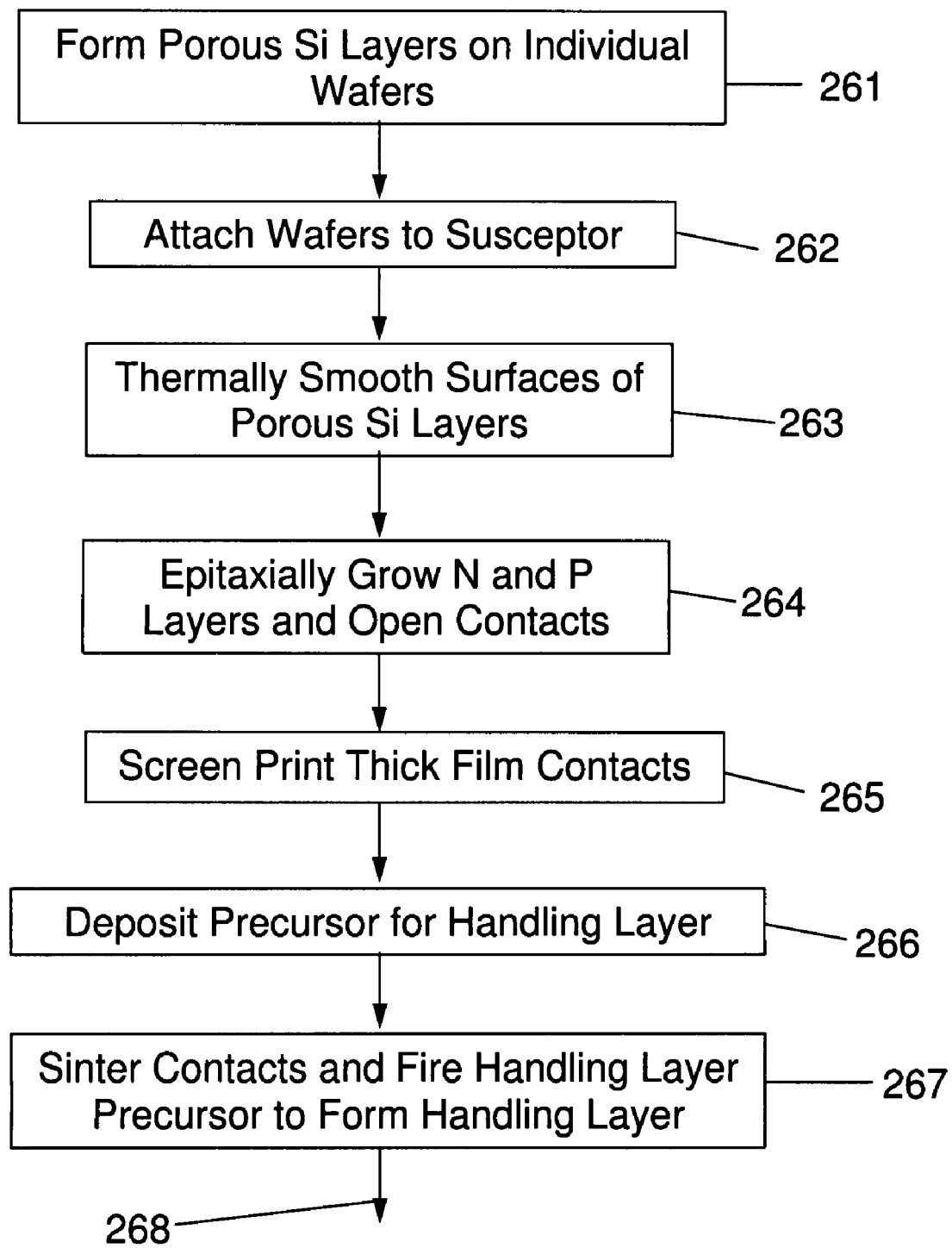
FIG. 23 is a flow chart of the first part of a manufacturing process for solar panels in a fourth embodiment of the present invention.

However, for the manufacturing sequences described in FIGS. 22 and 23, a different anodization arrangement may be employed. An anodic etcher 621 illustrated in the schematic sectioned isometric view of FIG. 7 is capable of simultaneously etching a number of wafers 631, each attached in a vertical orientation to a support frame 630. Note that in this case, although multiple wafers may be simultaneously etched, thereby improving etching throughput, these wafers are not yet detachably attached to a susceptor, and are, instead, attached to the support frames 630, which form seals against the internal walls of the etch chamber 621. Either round or square wafers 631 may be attached to the support frames 630 mounted within etch chamber 621, which can be much smaller than the etch chamber 601 of FIGS. 5 and 6. Electrodes 624, 625 are electrically connected to a power supply 628 though respective wires 626, 627. The top surface of the etch solution 623, typically hydrofluoric acid, filled into the anodization tank 621 should be below the tops of the support frames 630 and the support frames 630 should be sealed to the sidewalls of the anodization tank 621 to isolate the cells of the serial electro-etching apparatus to ensure that each wafer forms an electrode in the etching circuit.

It may be advantageous to vary the anodization process to form a low porosity film on the upper surfaces of wafers 611 or 631, and a higher porosity film below the low porosity film. Such a graded porosity has the advantage that the low porosity silicon layer may be easier to thermally smooth in the respective steps 203, 223, 243, and 263 in FIGS. 20-23) prior to epitaxial growth of the n-type and p-type layers in the PV cells. The electro-etching process for generating a high porosity film in the wafers has different etch parameters than the electro-etching process for generating a low porosity film, however the configuration of the electro-etching apparatus as shown in FIGS. 5-7 can be used for both cases and for some types of grading one electro-etching apparatus may serially anodize both sub-layers. The ability to modulate porosity by changing etch chemistry, etch current, or both has been an important innovation.

Thermal Smoothing

After the electro-etching processes illustrated in FIGS. 5 and 6 to produce the porous silicon surface layer, the wafer tile arrays, still attached to the susceptors 610, are removed from the anodization tank 601 for subsequent processing using various standard semiconductor processes, starting with thermal smoothing followed by epitaxial deposition of silicon in a reactor. In the case of the anodizaton tank 621 of FIG. 7, the wafers are typically remounted onto a susceptor carrying a closely packed array of solar wafer tiles including the mother wafers using the mounting methods described for susceptor 502 of FIG. 4. The windowed susceptor of FIG. 3 may be used in the epitaxial reactor described below if the wafers are sealed to the ribs; however, radiant heating of the wafers through the windowed susceptor presents challenges in accomplishing uniform heating. The planar susceptor of FIG. 2 is more easily used in a radiantly heated epitaxial reactor.

The exposed surface of the anodized porous silicon layer is advantageously smoothed to promote epitaxial growth of silicon on the porous layer. The smoothing may be performed as described in the aforecited Ser. No. 12/290,588 by annealing the mother wafer(s) in a hydrogen ambient at generally atmospheric pressure for a time of about 10 minutes and a temperature of 900 C or higher. Although the thermal smoothing can be done in conventional thermal processing oven, advantageously it is done when the mother wafers are mounted on susceptors, which are assembled into a wafer sleeve and thermally smoothed as a group, for example, using the radiantly heated epitaxial reactor described next.

Epitaxial Silicon Growth

The epitaxial reactor for depositing the silicon onto the conditioned surfaces of the source wafer template array has been described in detail by Sivaramakrishnan et al. in co-pending U.S. patent application Ser. No. 12/392,448, filed Feb. 26, 2008 and incorporated herein by reference. The epitaxial reactor has been designed to rapidly and simultaneously deposit silicon onto a large number of wafers by a thermal chemical vapor deposition (CVD) process using radiant lamps. As shown in the partially sectioned isometric view of FIG. 8, multiple wafers 720 are held on the interior surfaces of each of two susceptors 706 facing each other at close distance to confine the heat and the reacting gases close to the wafer surfaces. The assembly of two susceptors 706 and two end caps 701 forms a "wafer sleeve" with two open ends and having a relatively small interior volume. The two end caps 701 each have a tongue 702 which fits between the two susceptors 706, defining the spacings between the susceptors 706 at each susceptor edge.

The flow direction of the reactor gases flowing though the wafer sleeve between its open ends is reversed frequently in what is called "cross-flow processing" to avoid gas depletion at middle regions of the susceptor, thereby improving deposition thickness and resistivity uniformity. These features provide for excellent uniformity in temperature and reactive gas supply, ensuring highly uniform epitaxial silicon deposition. The reactor may be equipped with two or three reaction chambers in series, the first one to preheat the susceptor, the second for the deposition of the epitaxial silicon, and the last one to cool the succeptor. Dopant species can be bled into the reaction chamber, as necessary, to form as grown junctions. This reactor arrangement greatly enhances the throughput of the epitaxial reactor. Important advantages of the epitaxial reactor and process of this invention are: (1) a large-area vertical reactor with low volume to minimize gas cost and footprint; (2) a high-growth rate (2-10 µm/min) in the mass transport regime at temperatures exceeding 1000 C; (3) multiple wafer processing on two or more wafer susceptors that are processed simultaneously since the gases and incandescent heating lamp array is shared for two susceptors within the wafer sleeve; (4) lamp based heating for fast temperature cycling to enable a quick process sequence; and (5) efficient flow distribution for the silicon precursor trichlorosilane (TCS) with silicon conversion rates exceeding 50%.

In the case for processing the solar module of this invention, the substrates carrying the wafer arrays will constitute the susceptor. The gas flow is advantageously aligned with the shorter dimension of the solar array, again to minimize gas depletion effects in the center.

Figure 9:
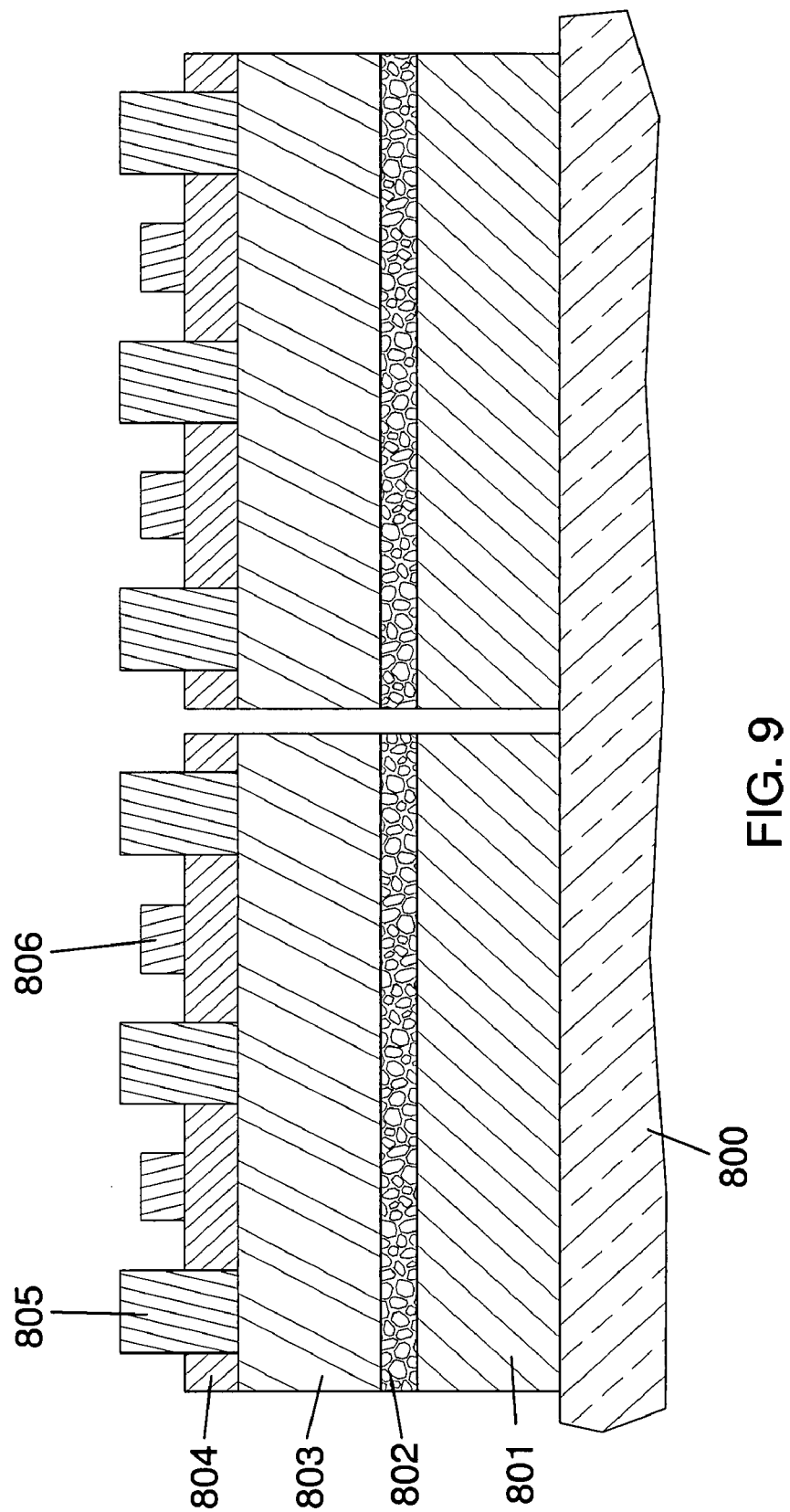
FIG. 9 is a schematic side cross-sectional view of two mother wafers attached to a susceptor with PV cell structures formed on the upper surfaces of each mother wafer.

FIG. 9 is a schematic side cross-sectional view of two mother or source wafers 801 attached to a susceptor 800 with PV cell structures epitaxially formed on the upper surfaces of each mother wafer 801 in the epitaxial reactor. Each PV cell includes at least one p-type layer 803 and at least one n-type layer epitaxially formed on top of a porous silicon layer 802 formed using the anodic etching process discussed in FIGS. 5-7. Note that if the anodic etching apparatus of FIGS. 5 and 6 is used, the porous silicon layer 802 will have been formed after attachment of the mother wafers 801 to the susceptor 800; but if the electro-etching apparatus of FIG. 7 is used, the porous silicon layer 802 will have been formed prior to attachment of the mother wafer 801 to the susceptor 800.

In either case, the growth process for the PV cells on the different mother wafers 801 proceeds in parallel using the vertical epitaxial reactor described above. After growth of the p-doped layers 803 of the PV cells, an n-doped layer 804 is epitaxially deposited. The order of the p-type and n-type layers can be reversed if desired.

Epitaxial silicon can be deposited with as-grown p-n junctions by adding suitable dopants during portions of the silicon deposition process, as shown in the two co-pending patent applications of K. V. Ravi and the co-pending patent application of Sivaramakrishna. Such junctions may also be formed after epitaxial growth by well known dopant thermal diffusion methods. The cell fabrication steps, including the contact formation methods described here are for examples only.

Contacts and Surface Layers

The susceptor and attached mother wafers are then removed from the epitaxial reactor and further processed for the formation of contacts and surface layers and separation from the template array and final processing. Depending upon the type of cell structure, some of the contact processing may be performed after the cell array has been removed from the template array.

Formation and patterning of the contacts are described in more detail in U.S. patent application Ser. Nos. 12/290,582 and 12/290,588. The relatively large sizes and spacings of the contacts allows printing, for example, by screen printing, of either the patterned contact material or of a patterned resist layer for deposition of the contact material through the resist mask.

Several different cell types can be fabricated on the epitaxial layer. These include cells requiring double-sided contacts such as the conventional homo-junction cells and so-called double hetero junction (HIT) cells, or single-sided contacts such as integrated backside contact (IBC) cells. In the case of the double-sided cells, the contacts on one side of the cell are formed on cells of the array while still attached to the mother wafers on the susceptor while the contacts on the other opposite side are formed after the entire array has been glued to a glass layer and subsequently separated from the mother wafers. The encapsulants used to bond the array to the backing sheet will limit the processing temperature for the second side metal contact formation. The IBC cells are well suited for the solar array fabrication of this invention because all of the contact fingers can be fabricated on the cells prior to array detachment. In this case, the only remaining processes required to be performed on the front side of the array are cleaning, texturing, low temperature depositions of passivation and anti-reflection layers, after the solar array is separated from the mother wafers attached to the susceptor.

The contacts can be fabricated using deposited thin films, such as TiPdAg, AlTiWCu—CuSn patterned using shadow or resist masks or can be formed using screen printed silver-based pastes. The latter require firing at elevated temperatures to sinter the silver and to obtain good electrical contact and adhesion to the wafer. It is worthwhile to note here that the infrastructure already exists to fabricate metal interconnect patterns on large form factor substrates in the printed circuit board and flat panel display industries.

In the embodiment of the backside contact of FIG. 9, openings in the n-type layer 804 are made, enabling p-layer connections 805 to contact the p-type layer 803 without shorting the n-type layer 804. Also, n-layer connections 806 are made to the n-layer 804. Details of a process sequence for backside contact wafer fabrication are provided in U.S. patent application Ser. No. 12/290,588.

Another aspect of the invention includes some module fabrication steps to achieve simultaneous separation of the epitaxial solar array from the source wafer template array. Prior to separation from the wafer template, the tops and sides of the entire array are encapsulated in a semi-rigid, that is, somewhat flexible, glue layer such as ethylene vinyl acetate, EVA, commonly used in solar module encapsulation, The glue layer unites the cell array into a single somewhat flexible and peelable entity. The glue layer is then used for attaching a rigid module support layer, such a glass or Tedlar, either before or after array separation.

Figure 10:
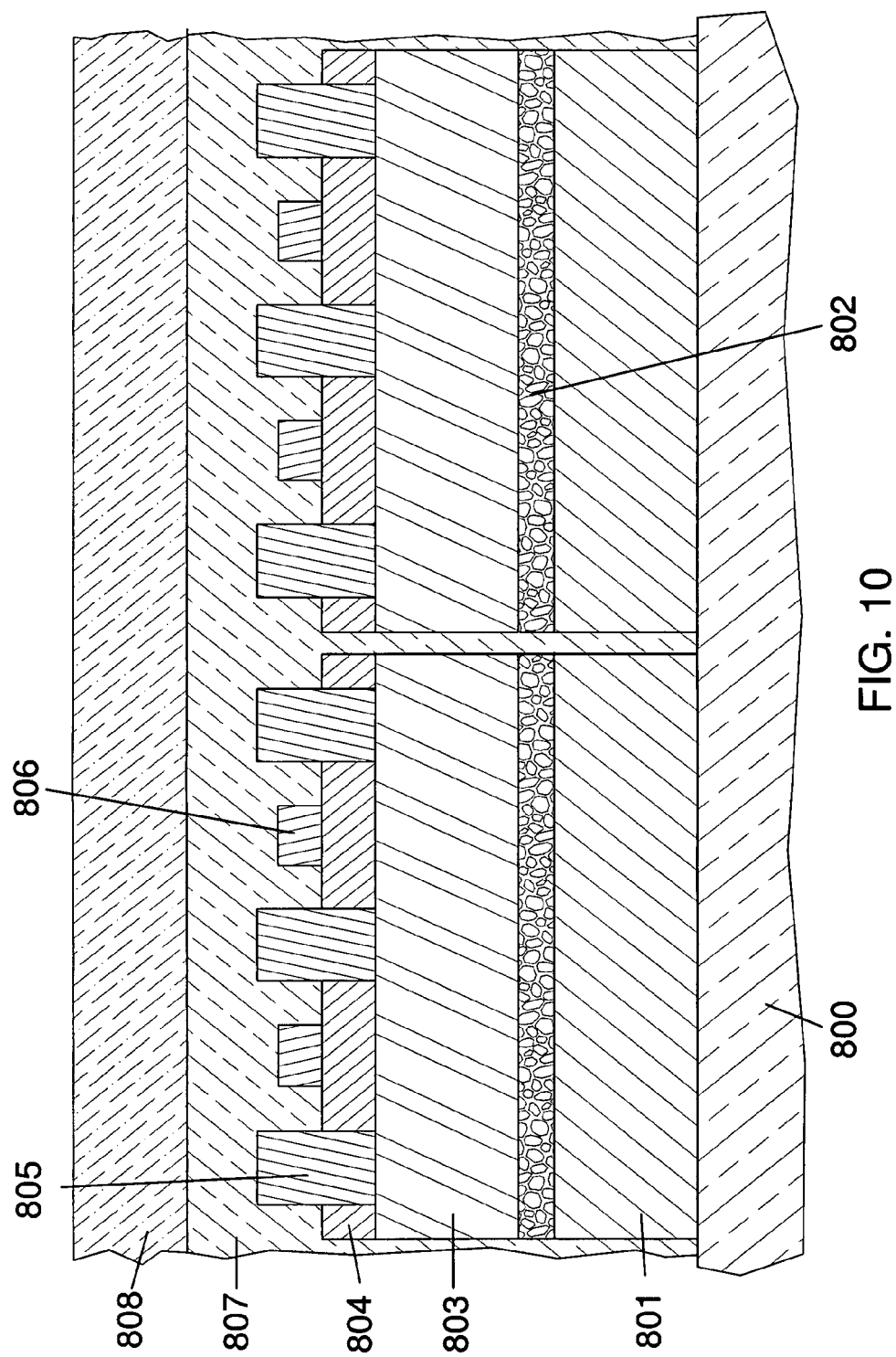
FIG. 10 is a schematic side cross-sectional view of the wafers and susceptor from FIG. 9 with a glue layer and glass layer attached to the upper surfaces of the PV cell structures which will become the backsides of the completed PV cells.

As shown in FIG. 10, a glue layer 807 and a module support layer 808 are added to the structure shown in FIG. 9. The glue layer 807 and module support layer 808 are array-level features for module support. Note that the glue layer 807 not only covers the PV cells and the PV cell contacts 805, 806, but may also flow down between the p-type and n-type layers 803, 804 of neighboring PV cells and between neighboring mother wafers 801, which are still attached to the susceptor 800. The illustrated top surface including the glue layer 806 and module support layer 808 will become the backside of the complete PV cells. The glue layer 807 flows around the p-n junction to hermetically encapsulate the solar cell. The module support layer 808, which may be formed of glass, is optional and is usually different from the final strengthening layer applied after defoliation. If it is used, it should be relatively flexible to permit defoliation by progressive peeling. In general, the glue layer 807 is less rigid than the soon to be described handle layer and than the support layer 808.

As noted earlier for this aspect of the invention, in order for the entire cell array to be successfully separated as one unit, the individual cells may be 'conditioned' to easily peel or separate from the porous silicon layer. This conditioning starts with proper surface preparation of the source wafers prior to anodization assuring a preferred structure for the porous layer stack, and the overall uniformity of this stack within wafers, wafer-to-wafer, and array-to-array. This conditioning may also involve edge grinding or laser removal of the epitaxial layer that wraps around the edge of the source wafers.

Another aid for easy array separation with the required high yields is to minimize the possibility of breakage of the thin epitaxial cells during the separation process. The polymeric glue encapsulation and the rigid or semi rigid substrate backing spanning the entire array may adequately assure this. Another way to assure that the individual cells do not break during separation involves forming a rigid 'handling layer' on the individual cells, which serves as a rigd backbone for the thin cells. A preferred low cost approach is to fabricate such a handling layer in situ from deposited or dispensed precursors on top of the epitaxial cells. If the cell contacts are made by thin film methods, this rigid handling layer is made from polymeric materials from precursors. Examples of suitable polymeric materials include epoxies, polyurethanes, cyanate resins, preferably filled with inert fillers such as fumed silica, cordierite inorganic glass powders or fibers. Asphalt and similar materials may also be suitable for forming the handling layer. The precursors, in the form of viscous solutions, are dispensed on top of the finished cells, and cured, as necessary to set and become rigid. When thick film silver pastes are used to form the contacts, the handling layer is formed by fusing a suitable glass, ceramic, or cermet handling layer onto the individual cells. Here again, a preferred approach is to deposit a slurry of the precursor powders on the epitaxial cells and sinter them at high temperatures to flow and adhere to the epitaxial cells. It is advantageous to deposit the powder precursors on top of the screen printed silver pattern and to sinter both together.

The material of the handling layer materials should be chosen to conformably coat and adhere well to the cell surface, including any metallization thereon and to have a coefficient of thermal expansion (CTE) close to that of silicon. Examples of suitable insulating materials useful for such in situ substrate fabrication include certain vitreous glasses (examples Pyrex, Corning glass 7070), glass and ceramic mixtures which together fire at the required temperatures while giving rise to a rigid body with a CTE matched to silicon, devitrifiable glasses which sinter and crystallize simultaneously upon firing (examples include certain lithium alumino-silicate or magnesium alumino-silicate glasses, and mullite, 3 $Al_2O_3$-2 $SiO_2$). Cermet compositions that can be used for this application are Si—SiC and Al—SiC. While the handling layer is intended to strengthen the epitaxial silicon cell, its attachment, or fabrication thereto, it also pre-disposes the cells for easy separation due to the small, but inevitable CTE mismatch stress between the handling layer and silicon. The cells provided with individual handles still need module encapsulation with semi-rigid EVA-type adhesives, to unite them into an array before or after array separation.

Figure 11:
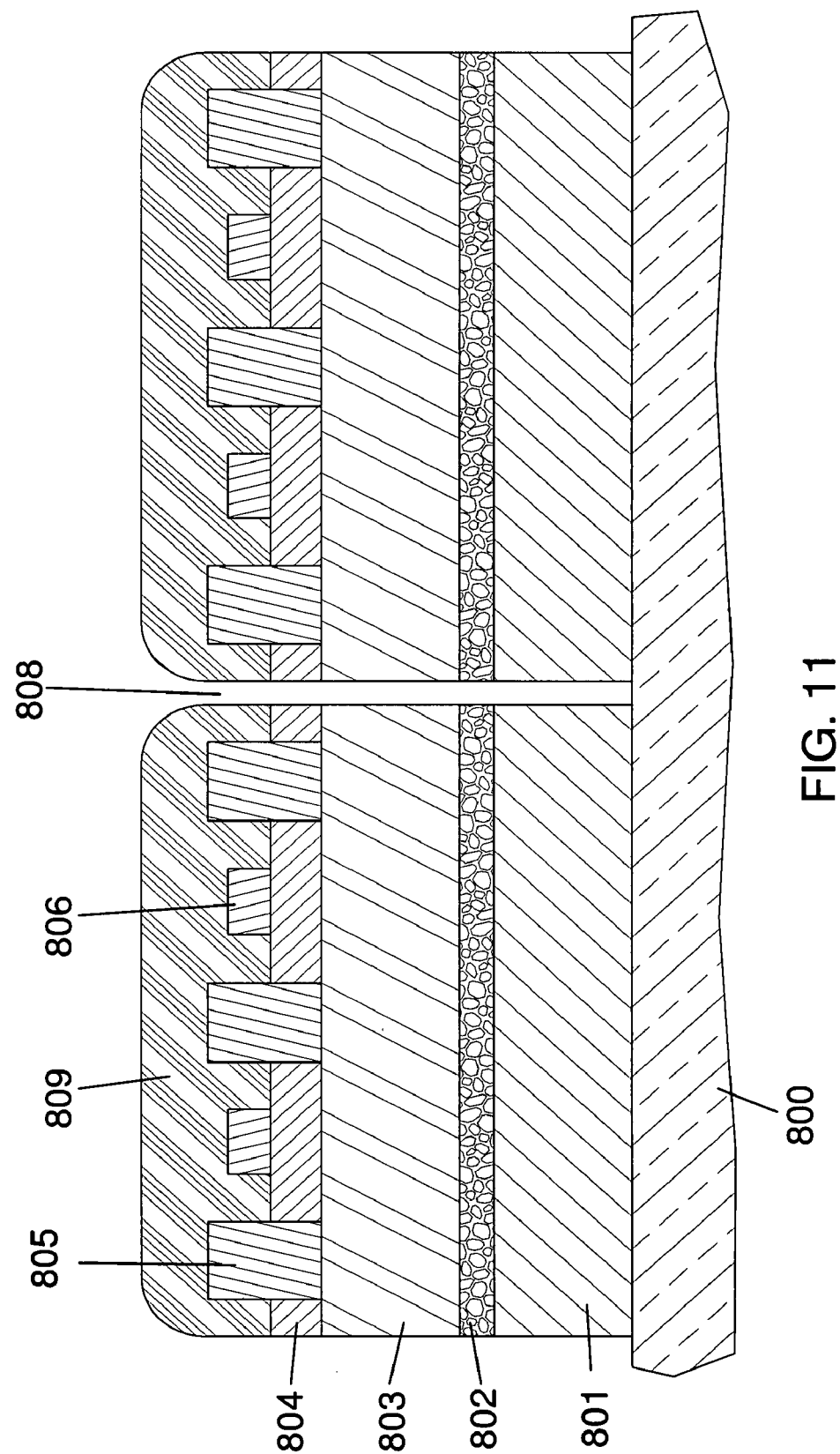
FIG. 11 is a schematic side cross-sectional view of the wafers and susceptor from FIG. 9 with a handling layer attached to the upper surfaces of the PV cell structures which will become the backsides of the completed PV cells.

An alternative process to that shown in FIG. 10 first deposits the precursor for a handling layer on the structure of FIG. 9, followed by heating to simultaneously sinter the contacts 805, 806 and to convert the handling layer precursor into a handling layer 809, illustrated in FIG. 11, separately covering each of the PV cells in the array. Due to surface tension and the deposition of the handling layer precursor away from the edges of the n-type layer 804, the handling layers 809 do not extend between neighboring PV cells but instead leave gaps 808 so that the rigid handling layer 809 does not prevent bending between cells during peeling. This difference should be considered because the stiffness of the handling layer, if it were to bridge the PV cells, would make exfoliation difficult as shown in FIGS. 14-19. The handling layer is a cell-level feature, which may be formed in situ on the epitaxial silicon to reinforce it and to dispose it towards easy peeling.

The individual cells can be tested prior to separation by using either a cell-size or an array-size probe head. It should be recognized that the testing at this stage is limited to measuring some cell electrical characteristics and not directly cell performance. With a database of these characteristics, defective cells may be identified and replaced with single cells from storage, prior to encapsulation. Full cell and array level testing can only be done after the array separation and surface finishing and cell completion steps on the peeled surface.

Figure 12:
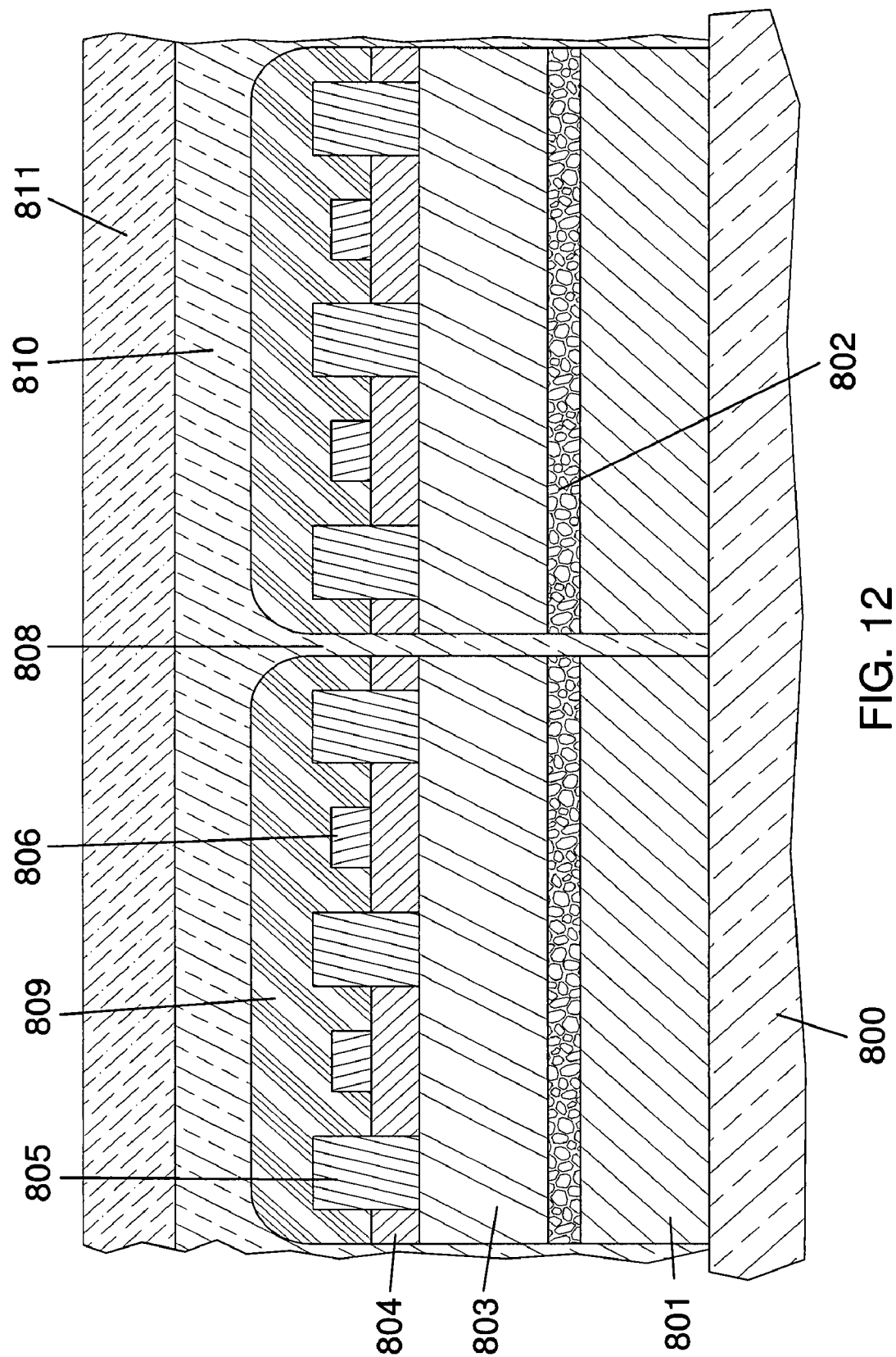
FIG. 12 is a schematic side cross-sectional view of the wafers and susceptor from FIG. 11 with a glue layer and glass layer attached to the upper surfaces of the handling layers which will become the backsides of the completed PV cells.

As shown in the schematic side cross-sectional view of FIG. 12, the glue layer 810 and the support layer 811 are attached to the upper surfaces of the handling layers 809, which will become the backsides of the completed PV cells. Again, as in FIG. 10, the glue layer 810 may flow down in the gap 808 between the handling layers 809 and then between the PV cells and mother wafers 801. If the glue layer 810 flows at least past the solar cell layer 803, it provides side encapsulation for the semiconductor layers and their junctions. The relative flexibility of the glue layer 810 does not prevent the bending between cell during peeling.

Figure 13:
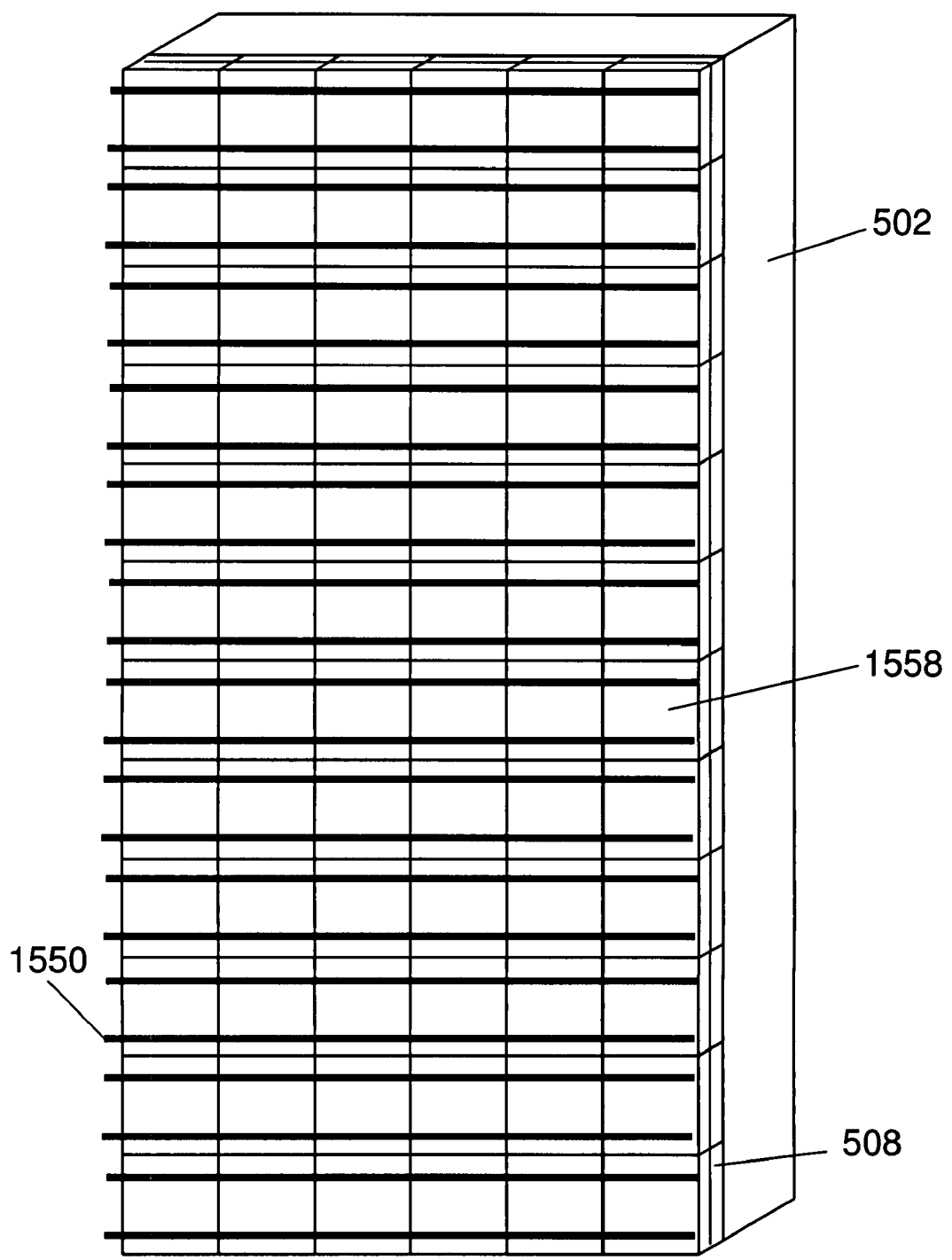
FIG. 13 is a schematic isometric view of a solar cell panel showing the metal connection strings.

As illustrated in FIG. 13, the cells in the array can be electrically connected to each other, i.e. strung together, in the required configuration by spot soldering a tin-coated copper strip 1550 to tabs (contacts) on the cells formed as part of the cell interconnections, prior to encapsulation. A large number (72 in this example) of PV cells 1558 may be been grown on top of the X-Y array of mother wafers 508 of FIG. 4.

Separation of the Epitaxial Silicon Cell Device Layer

For single cells, several techniques are described in the prior art for separating the epitaxial layer from the growth substrate when the separation layer is a porous silicon layer produced by the anodic etching method.

Japanese laid-open patent application 7-302889 describes a method bonding a second silicon wafer to the epitaxial layer, bonding plates to the silicon wafers, and then separating the plates by force from each other such that the epitaxial layer remains attached to the support substrate.

Japanese laid-open patent application 8-213645 is similar to the above but performs the separation after forming the p-n solar cell junction thereon while both the parent substrate and the support substrates are bonded to jigs with adhesive. The support substrates can be quartz or metal.

In U.S. Pat. No. 6,258,666, Mizutani et al. use a curved surface of a support substrate to peel the epitaxial film away from the growth substrate while the latter is secured on a support member by means of vacuum chuck, electrostatic chuck, or by mechanical clamps. A flexible polymer film, which could be self-adhering film or tape, is bonded to the epitaxial film, with an edge extending outwardly from the substrate serves to grip the film to initiate the peeling action. The edge of the film is then secured to drum-shaped, or blotter-shaped (semi-circle) support with a prescribed radius of curvature designed to peel the epitaxial film gently as the support member is rotated. Instead of using an adhesive tape, the holding and peeling of the semiconductor film can be, by vacuum suction, electrostatic suction, mechanical claws, and such.

Each of these methods is effective in separating the semiconductor film grown on a porous silicon layer of a source silicon substrate, but all have the shortcomings of needing secondary silicon, or other temporary support substrates, as well as other deficiencies not conducive to high productivity. Furthermore, these and other related methods are not easily scalable to perform the simultaneous peeling and separation of multiple epitaxial silicon layers from a pre-arranged array of source substrates carrying such films, which can enable enormous productivity in module fabrication, as will be detailed below.

Figure 14:
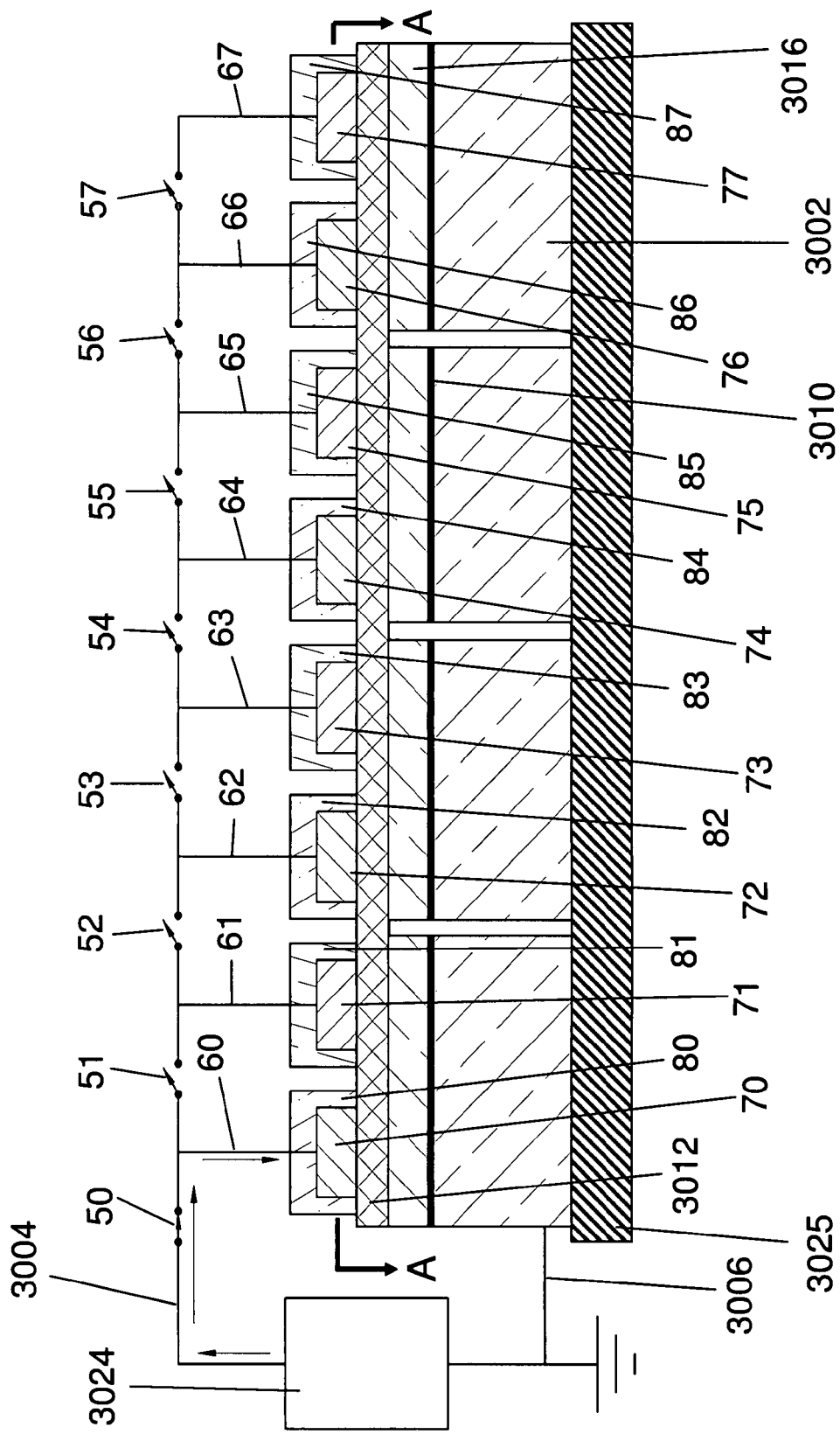
FIG. 14 is a side cross-sectional view of an array of wafer tiles covered by a flexible film and clamped to a segmented electrostatic chuck prior to separation of the highly porous silicon film. Cross-section A-A is illustrated.
Figure 15:
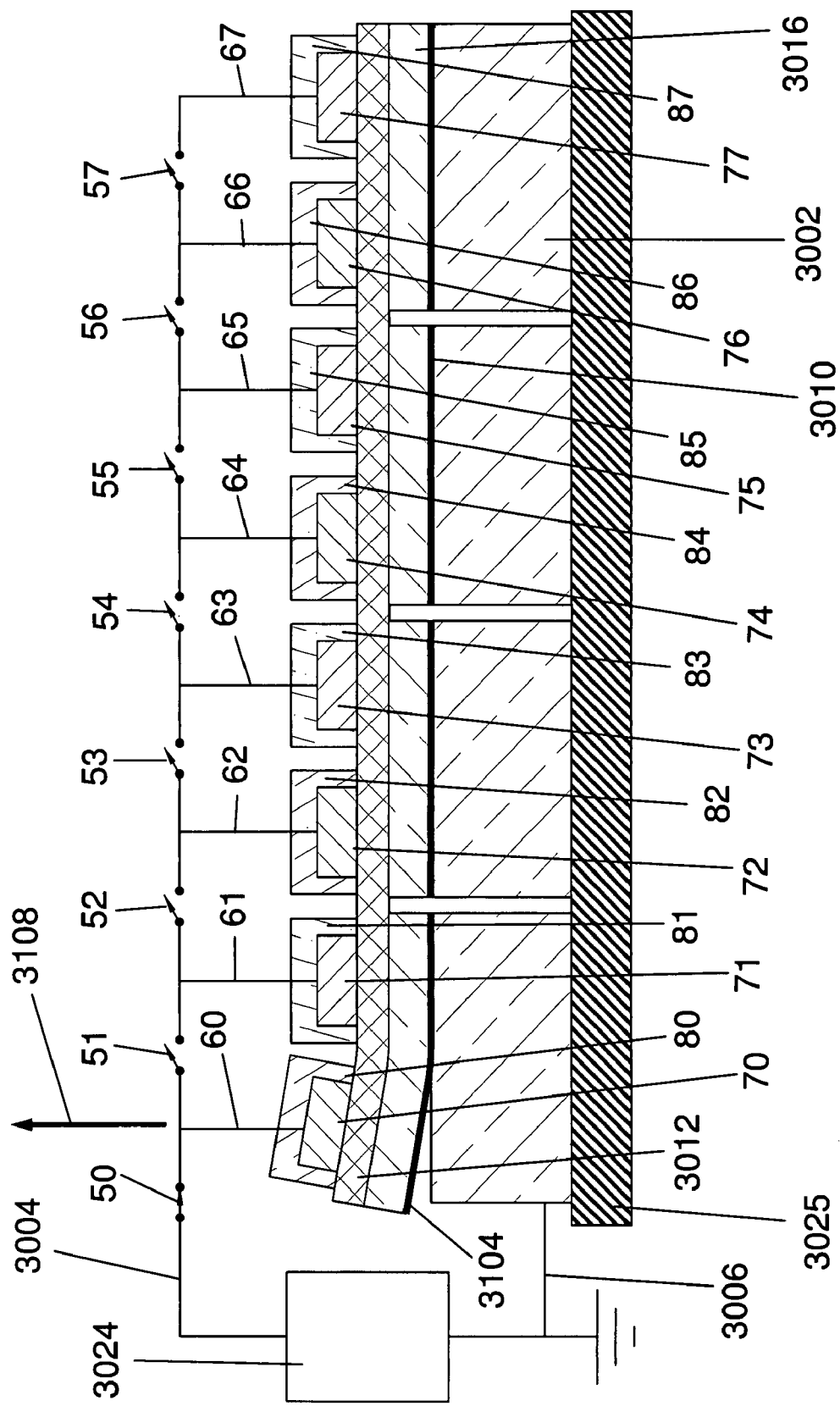
FIG. 15 is a side cross-sectional view of an array of wafer tiles covered by a flexible film and clamped to a segmented electrostatic chuck after the beginning of separation of the highly porous film etched in FIG. 7.
Figure 16:
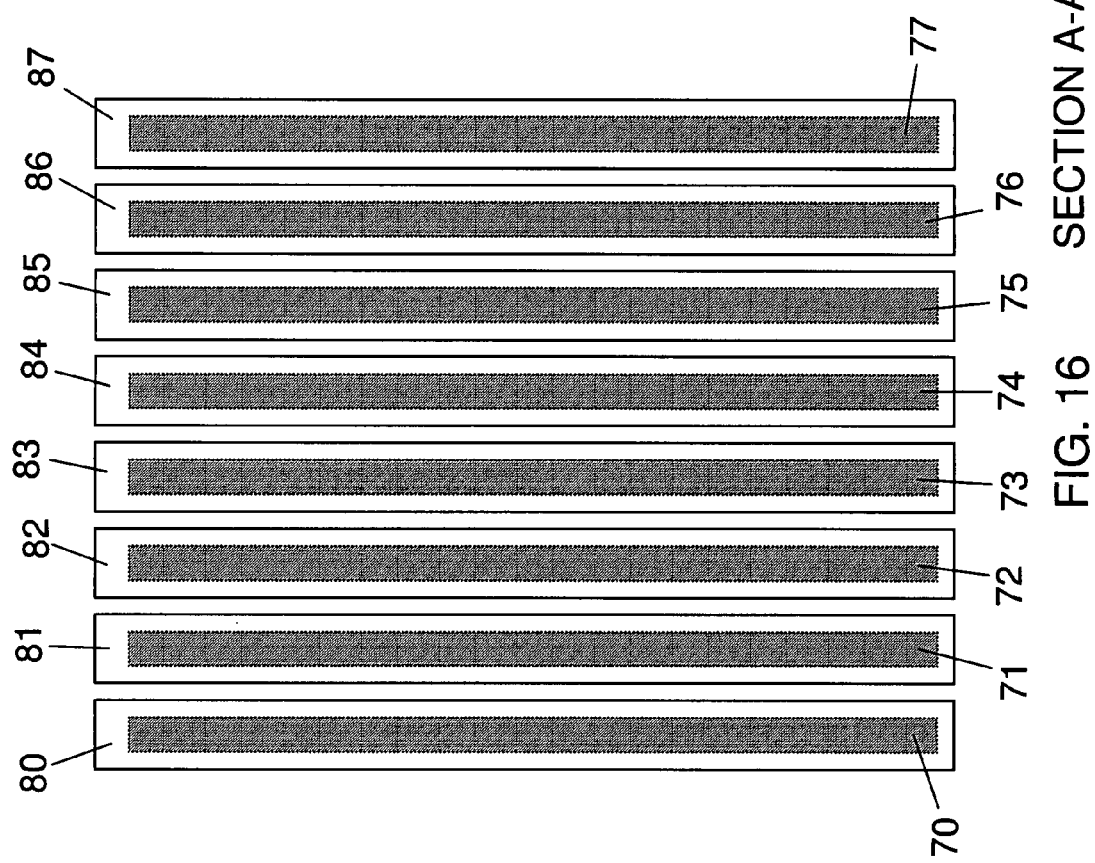
FIG. 16 is a top view through cross-section A-A of the electrostatic chuck in FIGS. 14 and 15.
Figure 17:
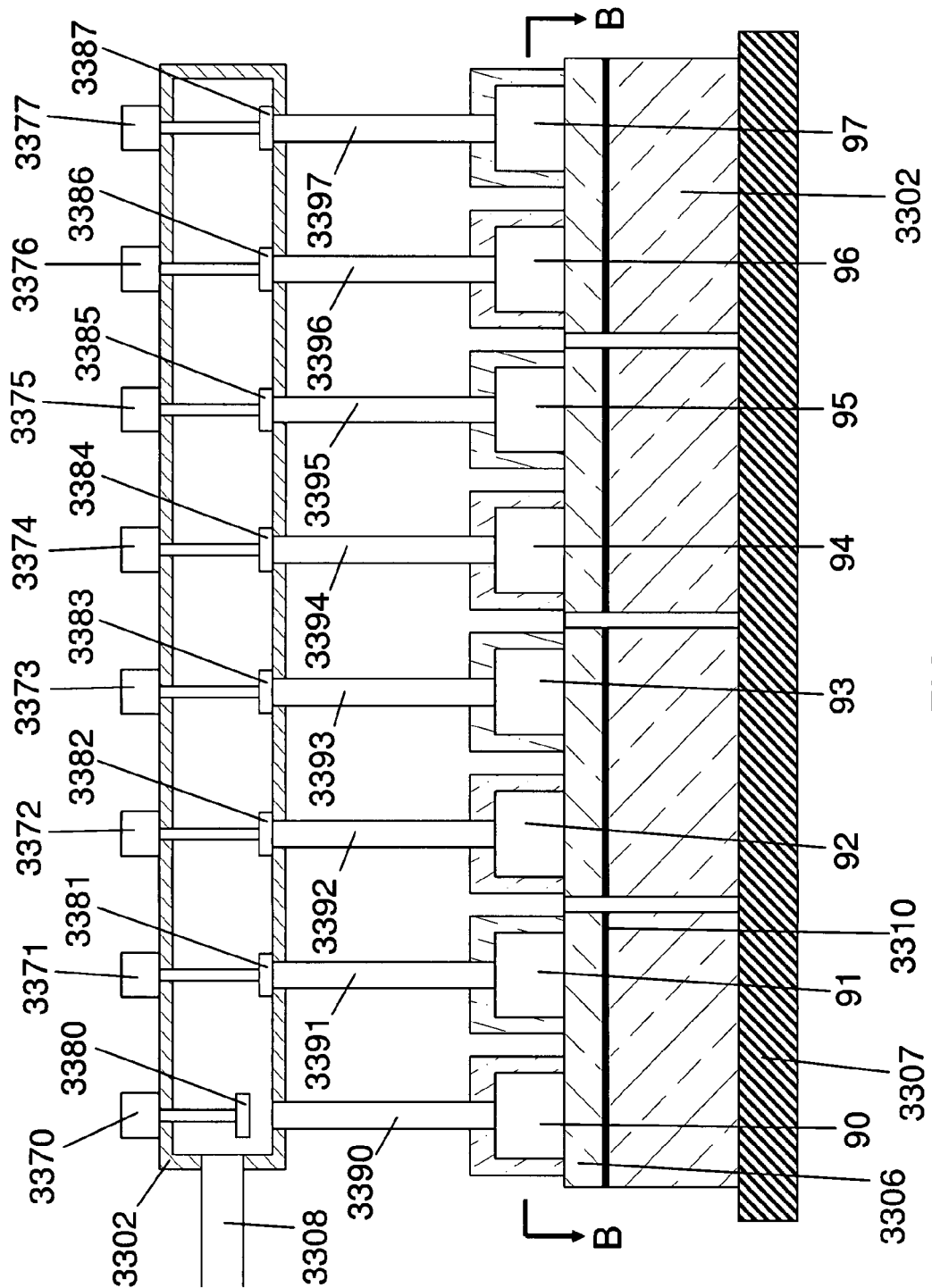
FIG. 17 is a side cross-sectional view of an array of wafer tiles not covered by a flexible film and clamped to a segmented vacuum chuck prior to the separation of the highly porous silicon film. Cross-section B-B is illustrated.
Figure 18:
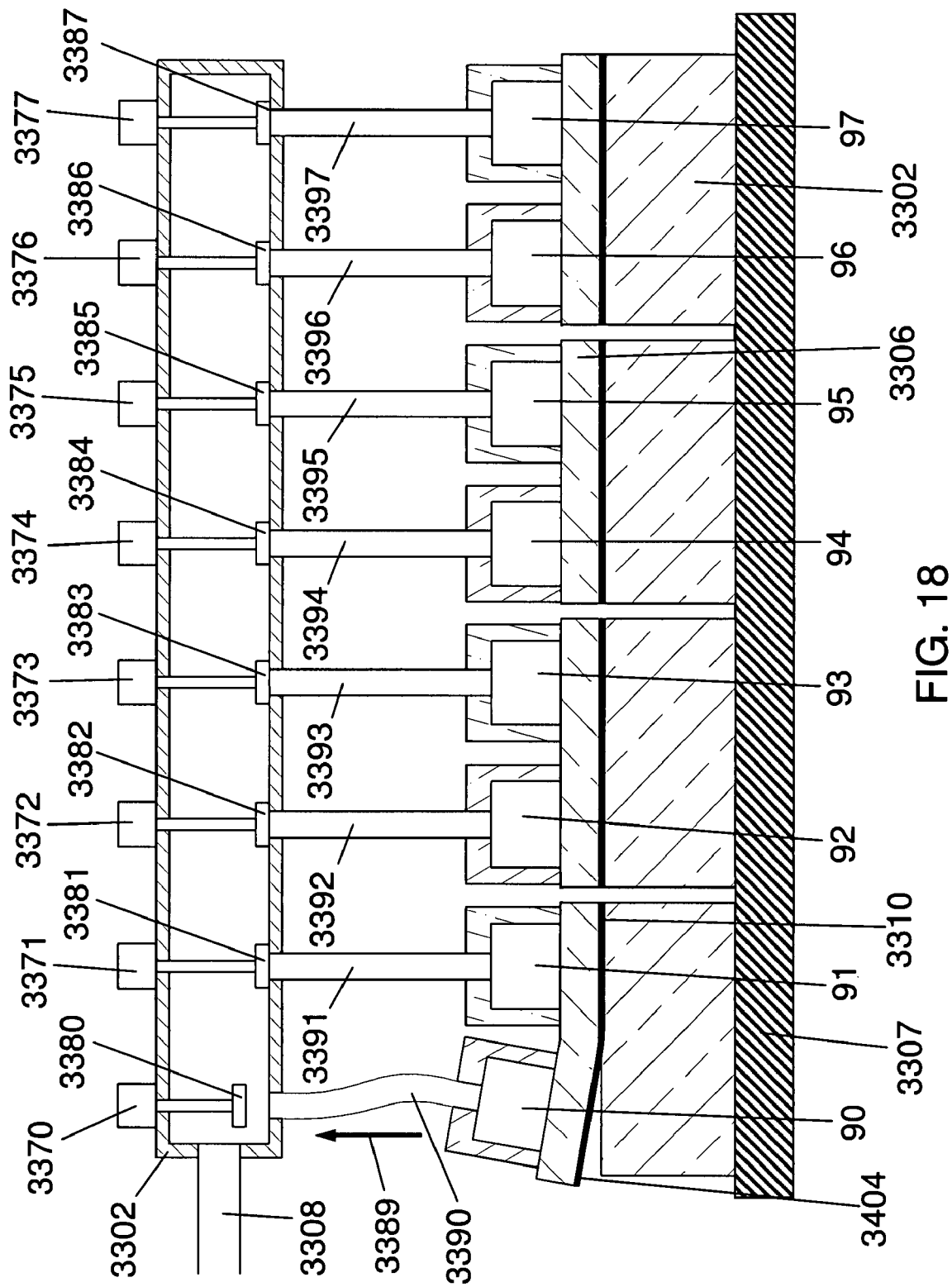
FIG. 18 is a side cross-sectional view of the array of wafer tiles not covered by a flexible film and clamped to a segmented vacuum chuck after the beginning of separation of the highly porous silicon film.

FIGS. 15 and 18 are schematic side cross-sectional views of the separation of the highly porous silicon layers anodically etched in either the anodization apparatus of FIGS. 5 and 6 or that of FIG. 7. The peeling process typically separates the porous silicon layer in each of the wafers into two layers: (1) a lower layer attached to the upper surface of the mother wafer; and (2) an upper layer attached to the PV cell structure. The surfaces of these two layers will both be physically and optically rough due to the separation process. This optical roughness can potentially increase the light collection efficiency of the solar cell since the upper layer attached to the PV cell structure forms the front surface of the final solar cell array. The separation process for the porous silicon film may be accomplished in a number of other ways, as illustrated in FIGS. 14-19 below.

Peeling by Electrostatic Clamping

In one embodiment of the separation process, an array of electrode strips, each smaller than the width of a wafer tile and electrically isolated from each other, are placed on a flexible polymer film bonded to the epitaxial silicon layer and acts as additionally as a dielectric layer. The flexible film may be the previously described glue layer. For progressive peeling, the potential is first applied between the outermost electrode, which is placed on the edge of the flexible film, and the grounded silicon source substrate. This localizes the electrostatic gripping to roughly the area covered by the electrode. As this electrode is lifted, it will apply an upward force on the epitaxial silicon layer directly underneath. When a sufficient upward force is applied, it will initiate peeling at the edge between the epitaxial layer and the source substrate. At this point, the next electrode in the array is activated and pulled up, to propagate the peel further. The peel having been already initiated at the edge, the force required to propagate the peel to this second region will be much less. This action is carried out across the entire array of electrode strips to complete the peeling of the epitaxial layer as the same actions are initiated on the electrode strip next to the electrode strips already peeled. To limit the upward pull of the electrodes, a mechanical stop can be placed on the electrode lift pins. To equalize the upward lift of all the electrodes, they can be tied to a tie bar made of a suitable dielectric such as a structural plastics or a ceramic such as alumina.

As illustrated in the cross-sectional side view of FIG. 14, an array of wafer tiles 3016 is encapsulated with a semi-rigid but somewhat flexible glue layer 3012 and clamped overhead to a segmented electrostatic chuck prior to separation of the highly porous silicon films 3010 formed in either the anodization tank of FIGS. 5 and 6 or that of FIG. 7. The segmented electrostatic chuck includes a plurality of clamping strips 70-77 enclosed and electrically isolated by respective dielectric films 80-87. The clamping strips 70-77 are juxtaposed to different ones of the wafer tiles 3016 across the semi-rigid glue layer 3012 and, as also shown along section line A-A in the top view of FIG. 16. Preferably, as shown in FIG. 14, multiple clamping strips are juxtaposed to each of the wafer tiles 3016 so that each tile is subjected to a gradual peeling including bending of the separate wafer tiles 3016. Peeling action may be initiated from the left in the illustration of FIG. 14, then progressively moving to the right.

An electrostatic clamping power supply 3024, preferably a DC power supply, is connected through a first electrical connection 3006 to either mother wafers 3002 or a substrate support 3025, which may be the previously described susceptor. The substrate support 3025 may be at ground potential as shown in the figure; however, another potential may be used for proper clamping operation. The other output of the power supply 3024 is connected through a second electrical connection 3004 to a series of switches 50-57 as shown, all but the switch 50 separating different ones of the electrostatic clamping strips 70-77. When switch 50 is closed as shown, the clamping voltage is applied to the first electrostatic clamping strip 70 through a first electrical connection 60. Similarly, when the switch 51 is also closed, the clamping voltage is applied to the second electrostatic clamping strip 71 through a second electrical connection 61. Similarly, the clamping voltage is sequentially applied to the remaining serially arranged electrostatic clamping strips 72-77 through electrical connections 62-67.

The electrostatic clamping strips 70-77 are applied to the top of the flexible film 3012 on top of multiple solar cells 3016. Porous separation layers 3010, which may be formed in either the anodization tank of FIGS. 5 and 6 or that of FIG. 7, separate the respective solar cells 3016 and the mother wafers 3002. Each of the electrostatic clamping strips 70-77 is attached to a mechanical actuator (not shown) capable of moving clamping strips 70-77 individually in a vertical up-down motion 3018 illustrated for the first clamping strip 70 in the side cross-sectional view of FIG. 15.

The figure shows the initiation of peeling of the solar cells 3016 from the substrates 3002 by separation (exfoliation) across the porous silicon layers 3010 for the portion of the solar cell 3016 underlying the first electrostatic clamping strip 70, which had been activated by the closing of by the closing of the first switch 50 At this point, the remaining electrostatic clamping strips 71-77 are not yet activated, that is, are not yet clamping the associated solar cell 3016 since the switches 51-57 remain open. Upwards arrow 3108 represents a vertical pulling motion by a mechanical actuator (not shown) attached to electrostatic clamping strip 70. Due to the electrostatic clamping action between the first clamping strip 70 and the leftmost solar cell(s) in the array of solar cells 3016, when the first clamping strip 70 is pulled up by the actuator, the leftmost solar cell(s) are also pulled up as shown by a separated (peeled or exfoliated) portion 3104 of the porous layer 3010 and the continuous flexible layer 3012 is bent between the attached and detached solar cells 3016. The remaining electrostatic clamping strips 71-77 are sequentially actuated in the sequence 71, 72, . . . 77 by the sequential closing of the switches 51-57 in the sequence 51, 52, . . . 57. Further mechanical actuators (not shown) respectively attached to the clamping strips 71-77 pull up on the other clamping strips 71-77 in the sequence 71, 72, . . . 77, thereby creating a peeling action from left to right in FIG. 15 to separate the array of solar cells 3016 from the mother wafers 3002.

It is possible to initially activate all of the clamping strips 70-77 in their down positions and then sequentially pull them up to perform the peeling operation across the solar cell array.

These actions of separating and lifting of the flexible dielectric film 3012 along with the epitaxial solar cell layer 3016 bonded thereto can be automated to make the operation scalable to large areas. The large-scale peeling advantageously allows for simultaneous peeling of a prearranged array of source wafers with their epitaxial films.

It is to be understood that the essential point of this aspect of the invention is the application of pulling force locally at an edge of the epitaxial film to grip and pull the edge of the film at its edge and thereafter to sequentially create similar forces and separations on adjacent areas of the film until the entire epitaxial layer is separated from the source wafer at the location of the separation layer. The idea transcends any specific means for creating these actions, such as specific electrode arrangements, the gripping means, or of the means for lifting the gripped film and such which results in a rolling motion across the array of solar cells.

Peeling by Vacuum Suction

In another embodiment, the entire peeling action may be accomplished by vacuum suction. The vacuum suction is applied locally through an array of vacuum 'strips' placed pressing on the film, starting from the outermost strips and working progressively across the others to the other side. The level of vacuum is designed to separate and lift the film from the source substrate. As this action is translated across the film, the separation proceeds in a predictable manner until the entire film is peeled and separated from the source wafer. Here again, the sequential activation of the vacuum strips in the array can be regulated by providing a feedback loop using fluidic devices and such, and thereby made to be reliable and reproducible for peeling epitaxial silicon layers from porous or other separation layers of mother wafers.

Figure 19:
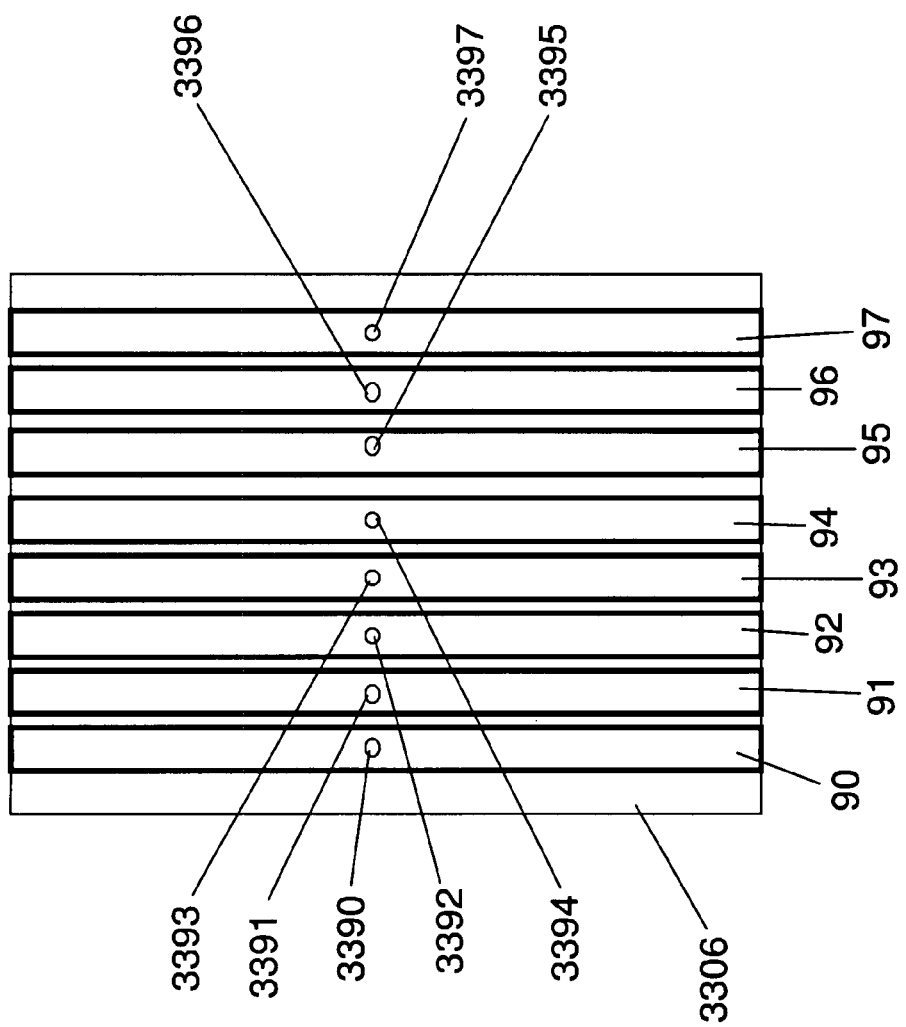
FIG. 19 is a top view through cross-section B-B of the vacuum chuck in FIGS. 17 and 18.

A progressive vacuum chucking system is illustrated in the side cross-sectional view of FIG. 17, in which an array of wafer tiles 3306 need not be covered by a flexible film but are directly clamped to a segmented vacuum chuck prior to separation of the highly porous film formed in either of previously described anodization tanks. Similarly to the progressive electrostatic peeling, in this embodiment, vacuum peeling action is initiated from the left, then moving to the right. A vacuum line 3308 connects a vacuum pump (not shown) to a manifold 3302, creating a vacuum within the manifold 3302. Multiple valve actuators 3370-3377 enable the opening and closing of respective valves 3380-3387. In FIG. 17, the first valve 3380 is shown open, and the remaining valves 3381-3387 are shown closed. Opening of the first valve 3380 causes a vacuum to be formed within a first vacuum clamping strip 90 forming the first segment of the segmented vacuum clamp. A first flexible hose connects the first vacuum clamping strip 90 to the first valve 3380 to selectively supply vacuum to it. The other valves 3381-3387 are similarly connected to the vacuum clamping strips 91-97 through respective flexible tubes 3391-3397. FIG. 19 is a top view through cross-section B-B of FIG. 17 of the eight vacuum clamping strips 90-97 and flexible tubes 3390-3397 in FIGS. 17 and 18.

The eight vacuum clamping strips 90-97 attach directly to the array of solar cells 3306 of FIG. 17. Porous separation layers 3310 separate the solar cells 3306 and mother wafers 3302 held on a support 3307. Each of the vacuum clamping strips 90-97 is activated by respective vacuum actuators 3370, 3371, . . . 3377 and is attached to one or more mechanical actuators (not shown) capable of moving clamping strips 90-97 individually in a vertical up-down motion, as shown in FIG. 18.

In an alternative embodiment, a semi-rigid glue layer may be positioned between the vacuum clamping strips 90-97 and the solar cells 3306, similar to the arrangement of FIGS. 14 and 15.

The side cross-sectional view of FIG. 18 illustrates the initiation of peeling of the solar cells 3306 (not covered by a semi-rigid glue layer in this illustration) from the support substrate 3302 by separation of a porous layer 3310. Upwards arrow 3389 represents a vertical pulling motion of a mechanical actuator (not shown) attached to the first vacuum clamping strip 90. Due to the vacuum clamping action between the first vacuum clamping strip 90 and the leftmost solar cell(s) in solar cell array 3306, when the first vacuum strip 90 is pulled up by the actuator, the leftmost solar cell(s) are also pulled up as shown by separation (peeling) 3404. The remaining vacuum clamping strips 91-97 are actuated in the sequence 91, 92, . . . 97 by the sequential opening of other valves 3381-3387 by the respective vacuum actuators 3371-3377 in the sequence 3381, 3382, . . . 3387. Mechanical actuators (not shown) attached to clamping strips 91-97 pull up on strips 91-97 in the sequence 91, 92, . . . 97, thereby creating a peeling action from left to right in the figure to separate the array of solar cells 3306 from the support substrate 3302.

Manufacturing Sequences

Figure 24:
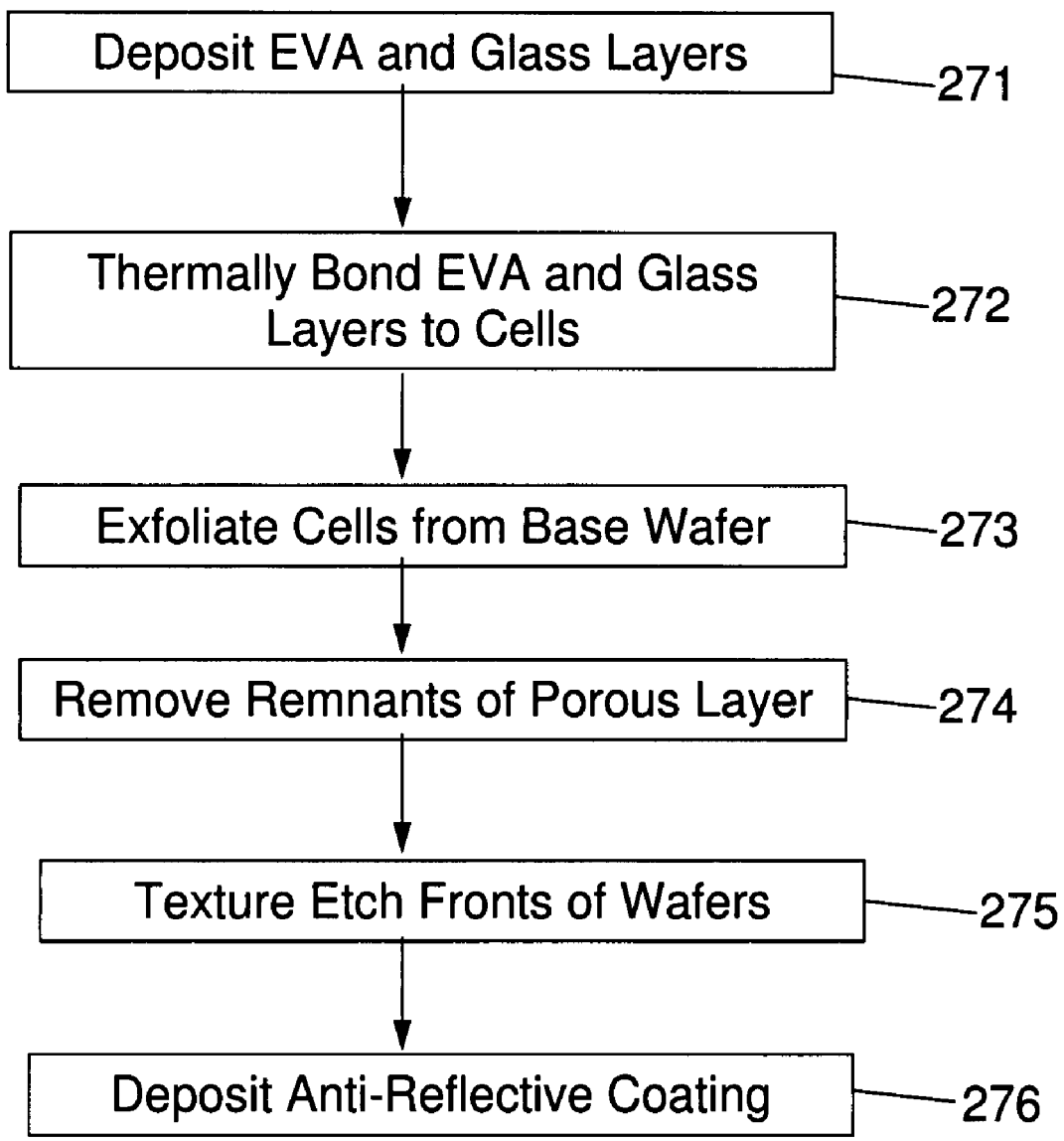
FIG. 24 is a flow chart of the final part of a manufacturing process for solar panels using PV cells with backside contacts only.
Figure 25:
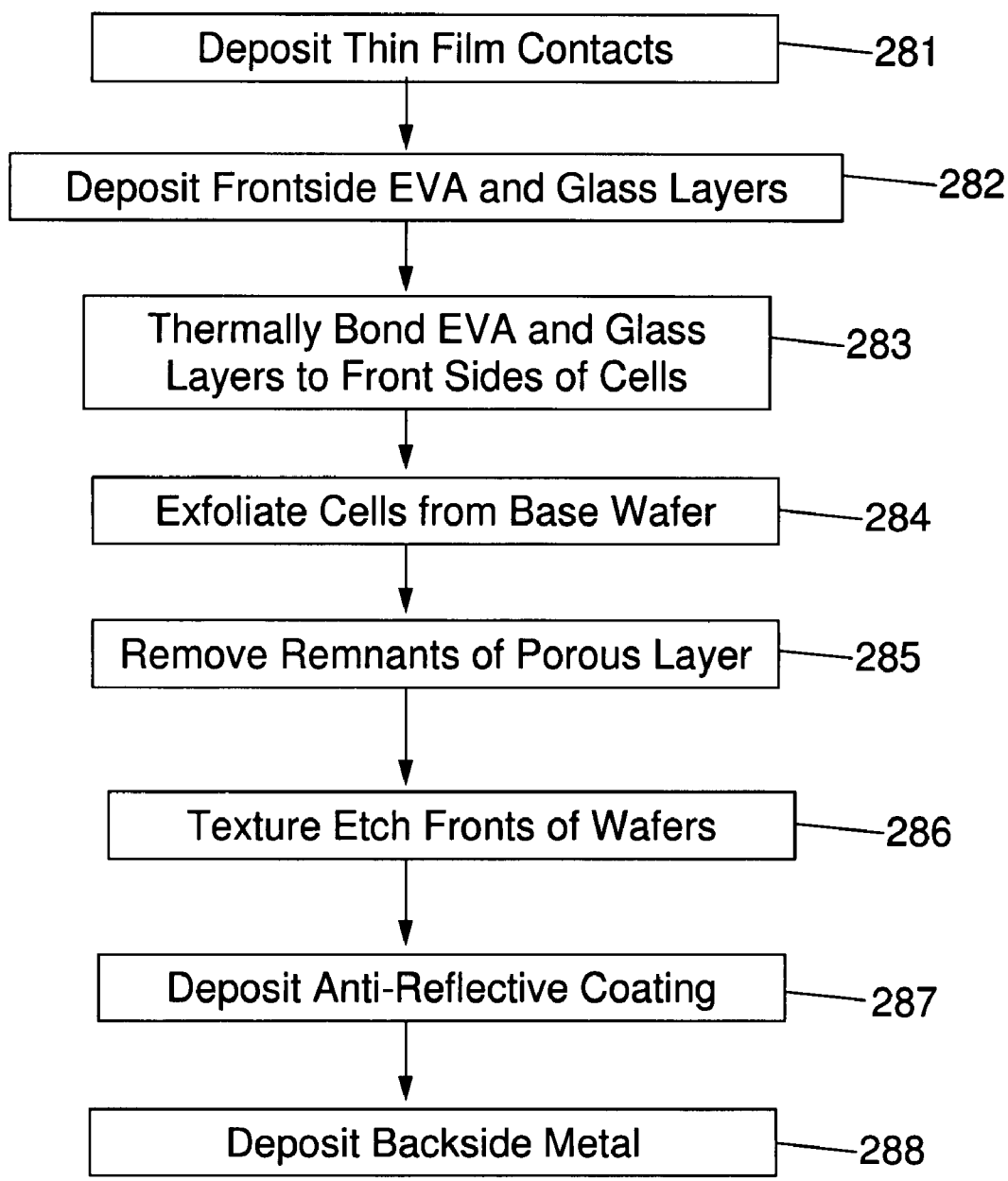
FIG. 25 is a flow chart of the final part of a manufacturing process for solar panels using PV cells with frontside and backside contacts.

Several alternative processing sequences can be used in the manufacture of solar cell assembly of the present invention. Four alternative sequences are illustrated in FIGS. 20-23 for the first part of the overall manufacturing process and two alternative sequences are illustrated in FIGS. 24 and 25 for the last part of the manufacturing process. Any of the sequences described in FIGS. 20-23 may be used with either of the sequences in FIGS. 24 and 25.

Embodiment 1

Figure 8:
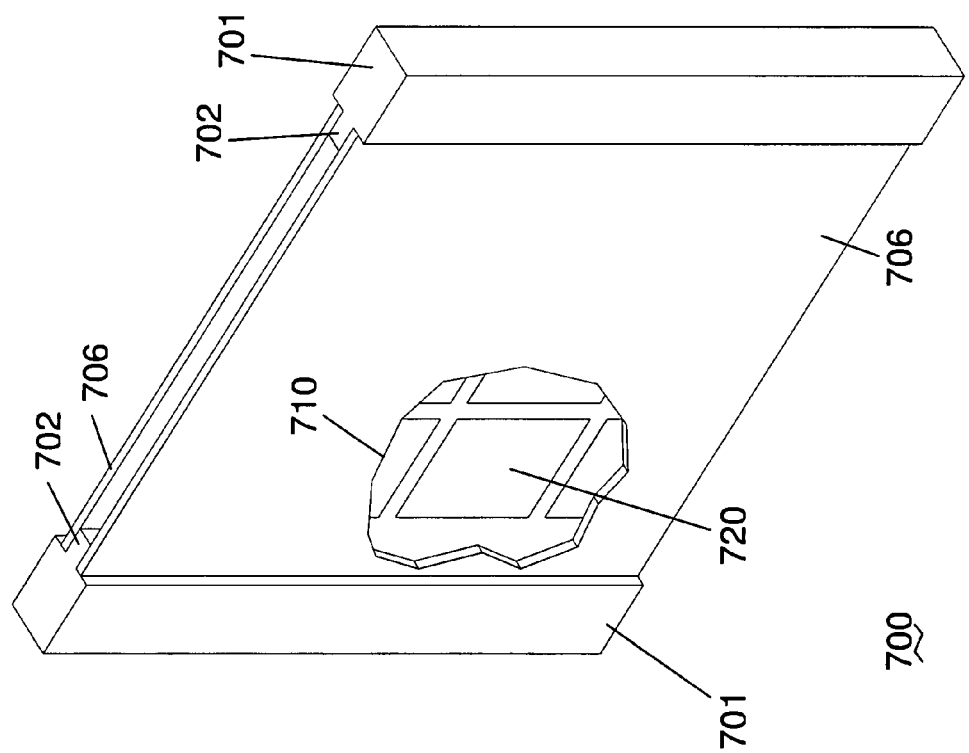
FIG. 8 is a schematic isometric view of a wafer sleeve comprising two susceptors, each with a multiplicity of wafers attached thereto.
Figure 20:
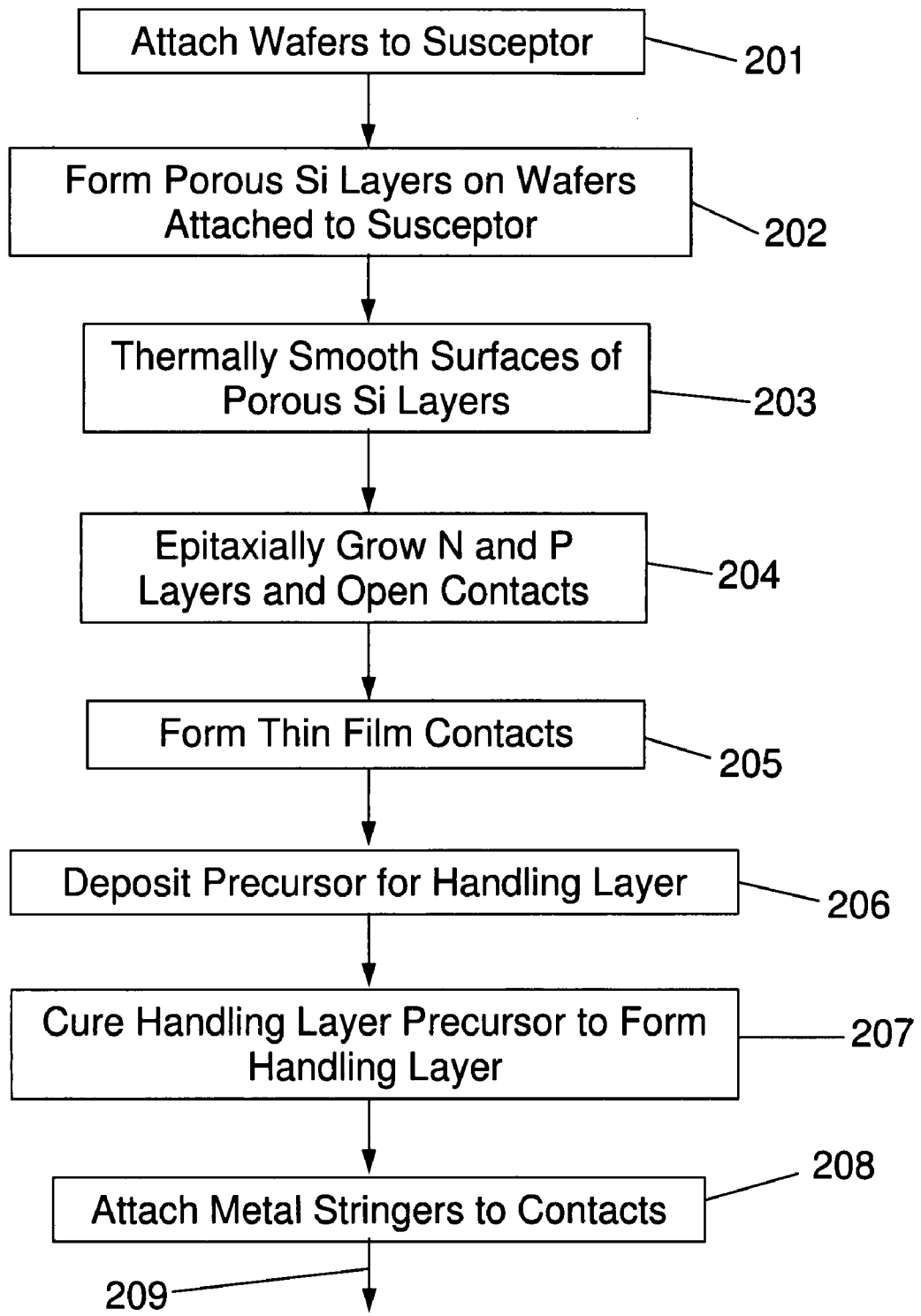
FIG. 20 is a flow chart of the first part of a manufacturing process for solar panels in a first embodiment of the present invention.

Attachment of the Wafers Prior to Formation of the Porous Layer, with the Use of Thin Film Contacts The flow chart of FIG. 20 illustrates a first embodiment of the first part of a manufacturing process for solar panels. In this process, in step 201, a number of mother wafers are attached to a susceptor, as described in FIGS. 2-4 above. The number of mother wafers may correspond to the full number of PV wafers in a solar panel or a fraction of the full number. Next, in step 202, porous silicon layers are formed on the surfaces of all the mother wafers using an anodization system such as that shown in FIGS. 5 and 6. One or more susceptors are then mounted into a wafer sleeve as shown in FIG. 8, which is designed to interface with an epitaxial reactor such as that described in U.S. patent application Ser. No. 12/392,448.

In step 203, the wafer sleeve comprising one or more susceptors loaded with mother wafers is heated to thermally smooth the surfaces of the porous silicon layers. This thermal smoothing process provides a sufficiently smooth and crystalline surface on which to grow the n-type and p-type layers comprising the PV cells. In the first part of step 204, epitaxial deposition processes fabricate the PV cells on top of the smoothed porous silicon layer.

After the wafer sleeve is cooled and removed from the epitaxial reactor or diffusion furnace, the wafer sleeve is disassembled to enable, in the second part of step 204, contact holes to be formed to the n-type and p-type layers of the cells. In step 205, thin film contacts are then formed on the surfaces of all the wafers attached to the respective susceptor.

Then, in step 206, the precursor for the handling layer is deposited on the wafer surfaces on the sides which correspond to what will be the back sides of the completed PV cells. Next, in step 207, the handling layer is formed by heating the handling layer precursor material deposited in step 206. In a variation on this processing sequence, the handling layer precursor of step 206 may be omitted. In step 208, metal stringers are then soldered or otherwise attached electrically to the contacts on the wafers as shown for the structure in FIG. 13.

Arrow 209 indicates that the solar panel fabrication process continues with the process of either FIG. 24 or 25, depending on the type of PV cells used (see below).

Embodiment 2

Figure 21:
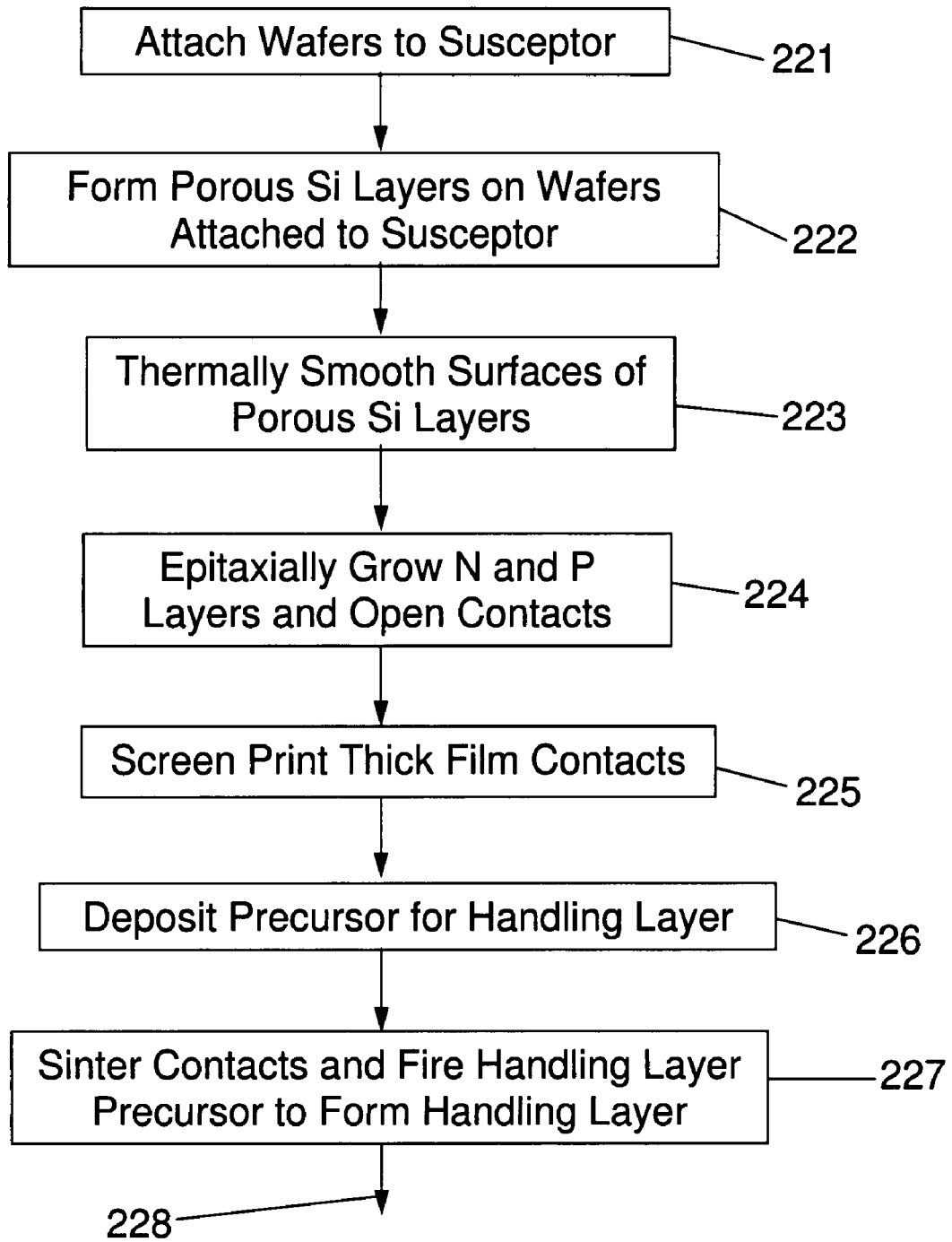
FIG. 21 is a flow chart of the first part of a manufacturing process for solar panels in a second embodiment of the present invention.

Attachment of the Wafers Prior to Formation of the Porous Layer with the Use of Thick Film Contacts The flow chart of FIG. 21 illustrates a second embodiment of the first part of a manufacturing process for solar panels. In this process, in step 221, a number of mother wafers are attached to a susceptor, as described above for FIGS. 2-4. The number of mother wafers may correspond to the full number of PV wafers in a solar panel or a fraction of the full number. Next, in step 222, porous silicon layers are formed on the surfaces of all the mother wafers using an anodization system such as that shown in FIGS. 5 and 6. One or more susceptors are then assembled into a wafer sleeve as shown in FIG. 8, which is designed to interface with an epitaxial reactor such as that described in U.S. patent application Ser. No. 12/392,448.

In step 223, the wafer sleeve comprising one or more susceptors loaded with mother wafers is then heated to thermally smooth the surfaces of the porous silicon layers. This thermal smoothing process provides a sufficiently smooth and crystalline surface on which to grow the n-type and p-type layers comprising the PV cells. In step 224, epitaxial deposition processes are used to fabricate the PV cells on top of the smoothed porous silicon layer and contact holes are formed to the n-type and p-type layers of the cells.

After the wafer sleeve is cooled and removed from the epitaxial reactor or diffusion furnace, the wafer sleeve is disassembled to enable in step 225 thick film contacts to be screen printed on the surfaces of all the wafers attached to the susceptors. In the process of FIG. 21, the screen printing process deposits thick film contacts not requiring the later attachment of metal stringers.

In step 226, the precursor for the handling layer is deposited on the wafer surfaces, on the sides which correspond to what will be the back sides of the completed PV cells. Next, in step 227, the handling layer is formed by heating the handling layer precursor material. Simultaneously, the metal contacts to the wafers are sintered to make good ohmic contact. In a variation on this processing sequence, the handling layer precursor may be omitted, in which case step 227 corresponds solely to the sintering of the metal contacts.

Arrow 228 indicates that the solar panel fabrication process continues with the process of either FIG. 24 or 25, depending on the type of PV cells used.

Embodiment 3

Attachment of the Wafers After the Formation of Porous Layers on Each Wafer with the Use of Thin Film Contacts The flow chart of FIG. 21 illustrates a third embodiment of the first part of a manufacturing process for solar panels. In this process, in step 241, porous silicon layers are first formed on the surfaces of each individual mother wafer using an anodization system such as that shown in FIG. 7. Next, a number of mother wafers are attached to a susceptor in step 242, as described above for FIGS. 2-4. The number of mother wafers may correspond to the full number of PV wafers in a solar panel or a fraction of the full number. One or more susceptors are then assembled into a wafer sleeve as shown in FIG. 8, which is designed to operate in an epitaxial reactor. The wafer sleeve comprising one or more susceptors loaded with mother wafers is then heated in step 243 to thermally smooth the surfaces of the porous silicon layers. This thermal smoothing process provides a sufficiently smooth and crystalline surface on which to grow the n-type and p-type layers forming the PV cells. In step 244, epitaxial deposition processes are used to fabricate the PV cells on top of the smoothed porous silicon layer, and contact holes are formed to the n-type and p-type layers of the cells.

After the wafer sleeve is cooled and removed from the epitaxial reactor or diffusion furnace, the wafer sleeve is disassembled to enable, in step 245, thin film contacts to be formed on the surfaces of all the wafers attached to the respective susceptors.

Prior to attachment of the stringers, in step 246, the precursor for the handling layer is deposited on the wafer surfaces, on sides which correspond to what will be the back sides of the completed PV cells. Next, in step 247, the handling layer is formed by heating the handling layer precursor material. In a variation on this processing sequence, the handling layer precursor may be omitted. In step 248, metal stringers are then soldered or otherwise attached electrically to the contacts on the wafers as shown in FIG. 13.

Arrow 249 indicates that the solar panel fabrication process continues with the process of either FIG. 24 or 25, depending on the type of PV cells used.

Embodiment 4

Attachment of the Wafers After the Formation of Porous Layers on Each Wafer, with the Use of Thick Film Contacts The flow chart of FIG. 23 illustrates a fourth embodiment of the first part of a manufacturing process for solar panels. In this process, in step 261, porous silicon layers are first formed on the surfaces of each individual mother wafer using an anodization system such as that shown in FIG. 7. Next in step 262, a number of mother wafers are attached to a susceptor, as described above for FIGS. 2-4. The number of mother wafers may correspond to the full number of PV wafers in a solar panel or a fraction of the full number. One or more susceptors are then assembled into a wafer sleeve as shown in FIG. 8, which is designed to operate with an epitaxial reactor such as that previously described.

In step 263, the wafer sleeve comprising one or more susceptors loaded with mother wafers is then heated to thermally smooth the surfaces of the porous silicon layers. This thermal smoothing process provides a sufficiently smooth and crystalline surface on which to grow the n-type and p-type layers forming the PV cells. In step 264, epitaxial deposition processes are used to fabricate the PV cells on top of the smoothed porous silicon layer and contact holes are formed to the n-type and p-type layers of the cells.

After the wafer sleeve is cooled and removed from the epitaxial reactor, the wafer sleeve is disassembled to enable, in step 265, thick film contacts to be screen printed 265 on the surfaces of all the wafers attached to the susceptors. In the process of FIG. 23, the screen printing process deposits thick film contacts not requiring the later attachment of metal stringers.

In step 266, the precursor for the handling layer is deposited on the wafer surfaces, on sides which correspond to what will be the back sides of the completed PV cells. Next, in step 267, the handling layer is formed by heating the handling layer precursor material. Simultaneously, the metal contacts to the wafers are sintered to make good ohmic contact. In a variation on this processing sequence, the handling layer precursor of step 266 may be omitted, in which case step 267 corresponds solely to the sintering of the metal contacts.

Arrow 268 indicates that the solar panel fabrication process continues with the process of either FIG. 24 or 25, depending on the type of PV cells used.

Completion of Solar Panel Using Backside Contact PV Cells

After the completion of the first part of the manufacturing processes of FIG. 20, 21, 22 or 23, one of two processes may be used for the second part depending on the type of partial cell completed in the first part.

The flow chart of FIG. 24 illustrates a first embodiment for the second part of the manufacturing processing for completing a solar panel in the case where backside contact PV cells were fabricated in the first part of the manufacturing process. The array of wafers containing the PV cell structures on their upper surfaces are still attached to the susceptor at this point. In step 271, a glue layer, such as EVA, is laid across the full array of wafers with a glass layer on top of it. If a handling layer was formed in one of the manufacturing sequences illustrated in FIGS. 21-23, then the EVA layer is on top of the handling layer, and in step 272, the EVA bonds the glass layer to the top surface of the handling layer as shown in FIG. 12. In the alternative case where the handling layer was not formed on top of the wafers, in step 272, the EVA bonds the glass layer to the top surface of the PV cells as shown in FIG. 10.

Next, in step 273, the susceptor mounting the mother wafers and PV cells and the EVA and glass layers is placed in an exfoliation system such as those illustrated in FIGS. 14-19. The exfoliation process leaves a portion of the porous silicon layer remaining on the top surfaces of the PV cells which are attached to the EVA and glass layer. This remnant porous layer is removed in step 274 by conventional etch processes as is familiar to those skilled in the art. To enhance the light collection efficiency of the solar panel, in step 275, the frontsides of the wafers are texture etched to form a surface which, when combined with the anti-reflective coating deposited in step 276, minimizes the reflection of light and thus improves the light collection efficiency for the solar panel.

Completion of Solar Panel Using Frontside and Backside Contact PV Cells

The flow chart of FIG. 24 illustrates a second embodiment for the second part of the manufacturing process for completing a solar panel in the case where both frontside and backside contacts were fabricated in first part of the manufacturing process. At this point, the array of wafers containing the PV cell structures on their upper surfaces is still attached to the susceptor. In step 281, thin film contacts are deposited on the exposed frontsides of the PV cells in the solar panel being fabricated. Next, in step 283, a frontside EVA layer and glass layer are laid across the panel and then thermally bonded to the frontsides of the PV cells.

Next, in step 284, the susceptor containing the mother wafers and PV cells and the EVA and glass layers on top is placed in an exfoliation system such as those illustrated in FIGS. 14-19. The exfoliation process leaves a portion of the porous silicon layer remaining on the top surfaces of the PV cells, which are attached to the EVA and glass layer. In step 285, this remnant porous layer is removed by conventional etch processes familiar to those skilled in the art. To enhance the light collection efficiency of the solar panel, in step 286, the frontsides of the wafers are texture etched to form a surface which, when combined with the anti-reflective coating deposited in step 287 minimizes the reflection of light and thus improves the light collection efficiency for the solar panel.

Finally, in step 288, backside metal is deposited to form the contacts to the backsides of the PV cells in the array. In step 289, strengthening layers are then deposited on the solar panel.

Module Configuration and Packaging

The support substrate attached with polymer adhesive film in the proceeding descriptions serves merely to provide mechanical support and environmental protection to the solar cell.

In one preferred embodiment, for the IBC cell type, the contacts to the cell are first made at discrete pad or via locations, by thin or thick film means, and the bus bars or fingers are made on a polymeric film or board, prior to bonding to the epitaxial silicon layer with EVA-type of glue. These bus bars are joined electrically to the appropriate pads on the cell during the lamination process. Forming the interconnection patterns on the flexible polymer film or substrate, or on a large glass plate, allows for it to be made offline, enabling significant reductions in the processing time on the source wafers, so that they can be made available for the next epitaxial film growth faster. Also, defective conductor patterns on the film can be repaired or sorted out, prior to placing them on the much more expensive epitaxial layers. The metallization for the interconnections can be made from sputtered metals such as tin coated chromium-copper, titanium-tungsten-copper, tin-coated copper, such as used in the printed wiring board industry. The material for joining of the cell to the bus bars has to be carefully chosen to enable good reliable ohmic contacts when cold pressed on to the contact pads or vias in the epitaxial layer. Examples of such metallization include silver or gold powders or flakes mixed with a polymeric material. The polymeric material used in the conductor pastes can be the same as the glue material used to attach the interconnection film or substrate to the epitaxial layer.

One great advantage of fabricating the contact and interconnection layers on the flexible film is that it can carry the interconnections, not just for a single epitaxial wafer, but for an entire solar panel consisting of several such epitaxial silicon wafers, placed in a pre-arranged array configuration. In combination with the peeling methods described above, which can be scaled to peel the films simultaneously from an array of source wafers, this invention may provide an unprecedented increase in productivity.

The invention thus provides efficient and economical manufacture of solar cell arrays in an economical small-scale set of equipment of simple design and adapted to automated operation. Thereby, inexpensive solar cell panels may be produced.

What is claimed is:

1. A solar panel fabrication method, comprising:
   simultaneously thermally smoothing surfaces of porous silicon layers, said porous silicon layers being on the surfaces of a plurality of substrates, said plurality of substrates being attached to a susceptor;
   simultaneously forming a photovoltaic (PV) cell on each substrate of said plurality of substrates, said PV cells being formed on said thermally smoothed surfaces; and
   simultaneously forming electrical contacts on each of said PV cells.

2. The method of claim 1, further comprising simultaneously forming said porous silicon layers on said plurality of substrates.

3. The method of claim 2, wherein said simultaneously forming said porous silicon layers comprises anodization in a liquid electrolyte.

4. The method of claim 3, wherein said substrates are attached to said susceptor during said simultaneously forming said porous silicon layers.

5. The method of claim 1, wherein said simultaneously forming electrical contacts includes:
   simultaneously forming a patterned contact precursor on each of said PV cells attached to said susceptor;
   depositing a handling layer precursor on each of said PV cells attached to said susceptor, said handling layer precursor covering said patterned contact precursor; and
   simultaneously heating said plurality of substrates attached to said susceptor to sinter said patterned contact precursor to said PV cells and to thermally convert said handling layer precursor into handling layers on said plurality of substrates, said handling layer not bridging neighboring ones of said PV cells.

6. The method of claim 1, further comprising:
   depositing a glue layer across all of said PV cells, said glue layer bridging neighboring ones of said PV cells;
   thermally bonding said glue layer to said PV cells; and
   exfoliating said PV cells from each of said plurality of substrates, said PV cells remaining attached to said glue layer.

7. The method of claim 6, further comprising:
   simultaneously texture etching said exfoliated surfaces of said PV cells; and
   simultaneously depositing an anti-reflective coating on said texture etched exfoliated surfaces of said PV cells.

8. The method of claim 6, further comprising, before said exfoliating, attaching a support layer to said glue layer.

9. The method of claim 6, further comprising removing the remnants of said porous silicon layers from exfoliated surfaces of said PV cells.

10. The method of claim 1, wherein said simultaneously forming electrical contacts includes screen printing.

11. The method of claim 1, further comprising:
    depositing a handling layer precursor on each of said PV cells attached to said susceptor; and
    simultaneously heating all of said plurality of substrates attached to said susceptor to thermally convert said handling layer precursor into handling layers on all of said plurality of substrates, said handling layer not bridging neighboring ones of said PV cells.

12. The method of claim 1, further comprising attaching metal stringers to said electrical contacts.

13. The method of claim 1, wherein said simultaneously forming a photovoltaic (PV) cell on each substrate of said plurality of substrates includes chemical vapor deposition.

14. The method of claim 1, wherein said PV cells include n-type and p-type silicon layers.

15. The method of claim 1, wherein said simultaneously forming electrical contacts is a thin film process.

16. The method of claim 1, wherein said simultaneously forming electrical contacts is a thick film process.

17. The method of claim 1, wherein said porous silicon layers comprise a low porosity layer over a high porosity layer.

18. The method of claim 1, wherein said porous silicon layers cover the entire top surfaces of said plurality of substrates attached to said susceptor.

* * * * *